(12) United States Patent
Harada et al.

(10) Patent No.: US 7,670,750 B2
(45) Date of Patent: Mar. 2, 2010

(54) POLYMER, RESIST PROTECTIVE COATING MATERIAL, AND PATTERNING PROCESS

(75) Inventors: Yuji Harada, Joetsu (JP); Jun Hatakeyama, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/905,727

(22) Filed: Oct. 3, 2007

(65) Prior Publication Data
US 2008/0085466 A1    Apr. 10, 2008

(30) Foreign Application Priority Data

Oct. 4, 2006   (JP)   ............................... 2006-272631
Apr. 4, 2007   (JP)   ............................... 2007-097971

(51) Int. Cl.
G03F 7/00   (2006.01)
G03F 7/004  (2006.01)
C08F 16/24  (2006.01)
C08F 18/20  (2006.01)
C08F 216/12 (2006.01)

(52) U.S. Cl. ............... 430/270.1; 430/273.1; 430/311; 526/245; 526/247

(58) Field of Classification Search ............. 430/270.1, 430/273.1, 311; 526/245, 247
See application file for complete search history.

(56) References Cited

U.S. PATENT DOCUMENTS

| | | | | |
|---|---|---|---|---|
| 4,011,178 | A * | 3/1977 | Muse | .................... 524/356 |
| 5,541,037 | A | 7/1996 | Hatakeyama et al. | |
| 7,514,204 | B2 * | 4/2009 | Hatakeyama et al. | .... 430/270.1 |
| 2003/0078352 | A1 * | 4/2003 | Miyazawa et al. | .......... 526/245 |
| 2005/0250898 | A1 * | 11/2005 | Maeda et al. | ................ 524/544 |
| 2006/0036005 | A1 * | 2/2006 | Kanda et al. | .................. 524/55 |
| 2007/0087287 | A1 | 4/2007 | Watanabe et al. | |
| 2007/0122736 | A1 * | 5/2007 | Hatakeyama et al. | .... 430/270.1 |
| 2007/0275326 | A1 * | 11/2007 | Hatakeyama et al. | .... 430/270.1 |
| 2007/0298355 | A1 * | 12/2007 | Harada et al. | ............... 430/396 |
| 2008/0241736 | A1 * | 10/2008 | Kobayashi et al. | ....... 430/270.1 |
| 2009/0011365 | A1 * | 1/2009 | Kobayashi et al. | ....... 430/284.1 |

FOREIGN PATENT DOCUMENTS

| | | | |
|---|---|---|---|
| JP | 60-38821 | A | 2/1985 |
| JP | 62-62520 | A | 3/1987 |
| JP | 62-62521 | A | 3/1987 |
| JP | 5-74700 | A | 3/1993 |
| JP | 6-273926 | A | 9/1994 |
| JP | 9-246173 | A | 9/1997 |
| JP | 2803549 | B2 | 7/1998 |
| JP | 11-84639 | A | 3/1999 |
| JP | 2001-194776 | A | 7/2001 |
| JP | 2002-99090 | A | 4/2002 |
| JP | 2002-226470 | A | 8/2002 |
| JP | 2007-108451 | A | 4/2007 |

OTHER PUBLICATIONS

Lin, B.J. "Semiconductor Foundr, Lithography, and Partners", Proceedings of SPIE, vol. 4690, p. XXIX, (2002).
Owa, Soichi et al. "Immersion lithography; its potential performance and issues", Proceedings of SPIE vol. 5040, p. 724, (2003).
2nd Immersion Workshop, "Resist and Cover Material Investigation for Immersion Lithography", 2003.
Allen, Robert D. et al, "Design of Protective Topcoats for Immersion Lithography", Journal of Photopolymer Science and Technology, vol. 18, No. 5, pp. 615-619, (2005).
Murase, H. et al., "Neuer Begriff und ein Nano-Hybrid System fur Hydrophobie" XXIV Fatipac Congress Book, vol. B. pp. 15-38, (1997).
Murase, Heihachi et al., "Characterization of molecular interfaces in hydrophobic systems.", Progress in Organic Coatings, vol. 31, pp. 97-104, (1997).

* cited by examiner

*Primary Examiner*—Amanda C. Walke
(74) *Attorney, Agent, or Firm*—Birch, Stewart, Kolasch & Birch, LLP

(57) ABSTRACT

A resist protective coating material comprises a polymer comprising repeat units having formulae (1a) and (1b) and having a Mw of 1,000-500,000. $R^{1a}$ and $R^{1b}$ are H, F or alkyl or fluoroalkyl, $R^{2a}$, $R^{2b}$, $R^{3a}$ and $R^{3b}$ are H or alkyl, or $R^{2a}$ and $R^{2b}$, and $R^{3a}$ and $R^{3b}$ may bond together to form a ring, $0<a<1$, $0<b<1$, $a+b=1$, and $n=1$ to 4. The protective coating material is improved in water repellency and water slip. In the ArF immersion lithography, it is effective in preventing water penetration and leaching of additives from the resist.

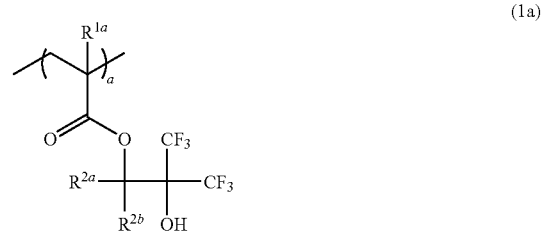

(1a)

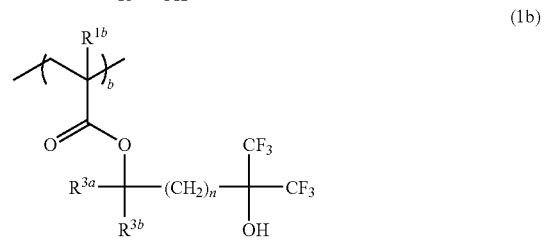

(1b)

25 Claims, No Drawings

POLYMER, RESIST PROTECTIVE COATING MATERIAL, AND PATTERNING PROCESS

CROSS-REFERENCE TO RELATED APPLICATION

This non-provisional application claims priority under 35 U.S.C. §119(a) on Patent Application Nos. 2006-272631 and 2007-097971 filed in Japan on Oct. 4, 2006 and Apr. 4, 2007, respectively, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a substrate, with a liquid (e.g., water) intervening between the lens and the substrate. More particularly, it relates to a resist protective coating material used to form a protective coating on a photoresist layer for protecting the photoresist layer and a process for forming a resist pattern using the same. It also relates to a polymer useful as the resist protective coating material.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size $\leq 0.25$ µm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\geq$0.9), is considered to comply with 65-nm node devices. For the fabrication of next 45-nm node devices, the $F_2$ lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems associated with the presence of water on a resist film were pointed out. For example, profile changes occur because the acid once generated from a photoacid generator and the basic compound added to the resist can be partially dissolved in water. The pattern collapses due to swelling. It is also pointed out that water droplets remaining on the resist film, though in a minute volume, can penetrate into the resist film to generate defects. To overcome these drawbacks of the ArF immersion lithography, it was proposed to provide a protective coating between the resist film and water (see the 2nd Immersion Workshop, Resist and Cover Material Investigation for Immersion Lithography, 2003).

In the lithography history, the protective coating on the photoresist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a photoresist film and stripping it after exposure. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the resist protective coating materials proposed thus far include amorphous polymers such as perfluoro(2,2-dimethyl-1,3-dioxol)-tetrafluoroethylene copolymers as disclosed in JP-A 5-74700. Since these fluorinated compounds are less compatible with organic substances, fluorocarbon solvents are used in coating and stripping of resist protective coating material, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005.

The water-soluble protective coating, however, cannot be used in the immersion lithography because the overlay on that coating is water or a similar liquid. In contrast, since the alkali-soluble resist protective coating material is strippable with an alkaline developer, it eliminates a need for an extra stripping unit and offers a great cost saving. From this standpoint, great efforts have been devoted to develop water-insoluble, alkali-soluble resist protective coating materials. For instance, a resist protective coating material comprising a methacrylate resin having fluorinated alcohol on side chain has been proposed.

Required for the resist protective coating material are not only the ability to prevent the generated acid and basic compound in the photoresist film from being leached out in water, but also such properties as water repellency and water slip. Of these properties, water repellency is improved by introducing fluorine into the resin and water slip is improved by combining water repellent groups of different species to form a micro-domain structure, as reported, for example, in XXIV FATIPEC Congress Book, Vo. B, p 15 (1997) and Progress in Organic Coatings, 31, p 97 (1997).

However, introducing fluorine into resins for the purpose of improving sliding angle, receding contact angle or the like results in resins with a greater contact angle with the alkaline developer, which in turn results in increased development defects.

Of recent concern are defects, so called "blob defects," occurring on the surface of a resist film after development. It is known that there is a tendency that these defects occur frequently in unexposed areas of a resist film and in a resist film having higher water repellency. As a general rule, a resist film having higher water repellency has a greater contact angle with water so that water remaining on the resist film surface assumes a high internal energy state during spin drying after development. The internal energy reaches maximum immediately before drying and causes damages to the resist film surface at the same time as evaporation of water, resulting in blob defects. In view of this mechanism, the contact angle on the resist surface after development must be reduced in order to prevent blob defects from occurring on the resist film.

When a resist protective coating having high water repellency is applied in order to improve sliding angle, receding contact angle and the like, the contact angle on the resist surface increases due to the intermixing between the resist film and the protective coating, allowing for a likelihood of blob defects. Use of a hydrophilic resist protective coating controls blob defects, but provides a smaller receding contact angle, which interferes with high-speed scanning and allows water droplets to remain after scanning, giving rise to defects known as water marks. There exists a demand for a resist protective coating which has a greater receding contact angle and a smaller contact angle on the resist surface after development.

The resist protective coating material is needed not only in the ArF immersion lithography, but also in the electron beam (EB) lithography. The resist undergoes changes in sensitivity during EB lithography for mask image writing or the like. The resist sensitivity changes due to evaporation of the acid generated during image writing, evaporation of vinyl ether produced by deprotection of acetal protective groups, or the like, as discussed in JP-A 2002-99090. It is desired to suppress resist sensitivity variation by coating a protective coating on top of the resist layer.

SUMMARY OF THE INVENTION

An object of the invention is to provide a resist protective coating material which can be removed with an alkaline developer and leaves few development defects; a polymer which is effective as a base polymer in the resist protective coating material; and a pattern forming process using the resist protective coating material.

The inventors have discovered that a polymer obtained through copolymerization of two monomers each containing a fluoroalcohol moiety is useful as a photoresist protective coating material in the immersion lithography.

Accordingly, the present invention provides a novel polymer, a resist protective coating material, and a pattern forming process, as defined below.

In a first aspect, the invention provides a polymer comprising repeat units having the general formulae (1a) and (1b):

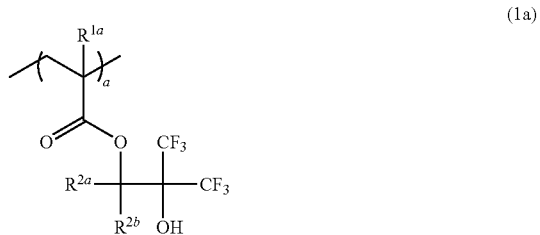

(1a)

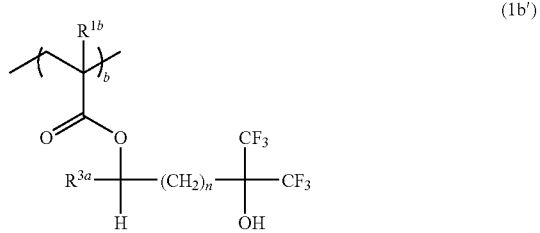

(1b)

wherein $R^{1a}$ and $R^{1b}$ are each independently hydrogen, fluorine or a straight or branched $C_1$-$C_4$ alkyl or fluoroalkyl group, $R^{2a}$, $R^{2b}$, $R^{3a}$ and $R^{3b}$ are each independently hydrogen or a straight, branched or cyclic $C_1$-$C_{20}$ alkyl group, or $R^{2a}$ and $R^{2b}$, and $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring, "a" and "b" are numbers satisfying 0<a<1, 0<b<1 and a+b=1, and n is an integer of 1 to 4, the polymer having a weight average molecular weight of 1,000 to 500,000.

Preferably, the polymer comprises repeat units having the general formulae (1a) and (1b'):

(1a)

(1b')

wherein $R^{1a}$ and $R^{1b}$ are each independently hydrogen, fluorine or a straight or branched $C_1$-$C_4$ alkyl or fluoroalkyl group, $R^{2a}$ and $R^{2b}$ are each independently hydrogen or a straight, branched or cyclic $C_1$-$C_{20}$ alkyl group, or $R^{2a}$ and $R^{2b}$ may bond together to form a ring with the carbon atom to which they are attached, and each of $R^{2a}$ and $R^{2b}$ is a straight, branched or cyclic $C_1$-$C_{20}$ alkylene group when they form a ring, $R^{3a}$ is a straight, branched or cyclic $C_3$-$C_8$ alkyl group, "a" and "b" are numbers satisfying 0<a<1, 0<b<1 and a+b=1, and n is an integer of 1 to 4.

In a second aspect, the invention provides a resist protective coating material comprising a polymer comprising repeat units having the general formulae (1a) and (1b):

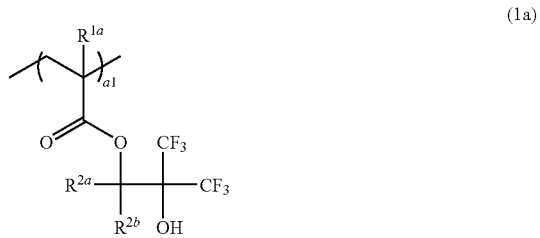

(1a)

-continued

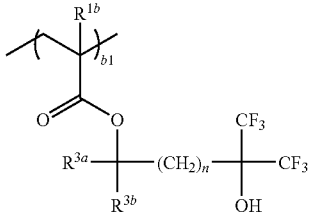

(1b)

wherein $R^{1a}$ and $R^{1b}$ are each independently hydrogen, fluorine or a straight or branched $C_1$-$C_4$ alkyl or fluoroalkyl group, $R^{2a}$, $R^{2b}$, $R^{3a}$ and $R^{3b}$ are each independently hydrogen or a straight, branched or cyclic $C_1$-$C_{20}$ alkyl group, or $R^{2a}$ and $R^{2b}$, and $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring, "a1" and "b1" are numbers satisfying 0<a1<1, 0<b1<1 and 0<a1+b1≦1, and n is an integer of 1 to 4, the polymer having a weight average molecular weight of 1,000 to 500,000.

In the preferred resist protective coating material, the polymer comprises repeat units having the general formulae (1a) and (1b'):

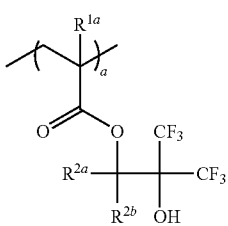

(1a)

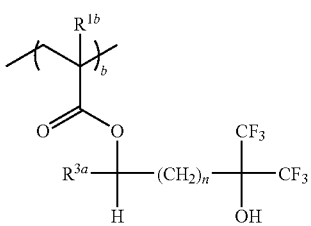

(1b')

wherein $R^{1a}$ and $R^{1b}$ are each independently hydrogen, fluorine or a straight or branched $C_1$-$C_4$ alkyl or fluoroalkyl group, $R^{2a}$ and $R^{2b}$ are each independently hydrogen or a straight, branched or cyclic $C_1$-$C_{20}$ alkyl group, or $R^{2a}$ and $R^{2b}$ may bond together to form a ring with the carbon atom to which they are attached, and each of $R^{2a}$ and $R^{2b}$ is a straight, branched or cyclic $C_1$-$C_{20}$ alkylene group when they form a ring, $R^{3a}$ is a straight, branched or cyclic $C_3$-$C_8$ alkyl group, "a" and "b" are numbers satisfying 0<a<1, 0<b<1 and a+b=1, and n is an integer of 1 to 4.

The resist protective coating material may further comprise a solvent. Preferably the solvent comprises an ether compound of 8 to 20 carbon atoms and/or an alcohol compound of 4 to 8 carbon atoms.

In a third aspect, the invention provides a lithography process for forming a pattern, comprising the steps of forming a photoresist layer on a substrate, forming a resist protective coating on the photoresist layer, exposing the layer structure to light, and developing, the resist protective coating being formed of the resist protective coating material defined above.

Preferably, the exposing step includes immersion lithography comprising irradiating light to the layer structure through a projection lens while keeping a liquid between the projection lens and the substrate. More preferably, the exposing step uses a light source having an exposure wavelength in the range of 180 to 250 nm and water as the liquid between the projection lens and the substrate. Also preferably, the developing step uses a liquid alkaline developer for thereby developing the photoresist layer to form a resist pattern and stripping the resist protective coating therefrom at the same time.

In a fifth aspect, the invention provides a lithography process for forming a pattern, comprising the steps of forming a protective coating on a photoresist layer disposed on a mask blank from a resist overlay material, exposing the layer structure in vacuum to electron beam, and developing, the resist overlay material being the resist protective coating material defined above.

BENEFITS OF THE INVENTION

The resist protective coating material of the invention has a greater contact angle with water enough to inhibit penetration of water into the coating during immersion exposure. The immersion lithography can be conducted in a satisfactory manner, leaving few development defects.

DESCRIPTION OF THE PREFERRED EMBODIMENTS

The present invention may be understood more readily by reference to the following detailed description of preferred embodiments of the invention and the examples included herein. In this specification and in the claims which follow, reference will be made to a number of terms which shall be defined to have the following meanings.

The singular forms "a", "an" and "the" include plural referents unless the context clearly dictates otherwise.

The notation (Cn-Cm) means a group containing from n to m carbon atoms per group.

Polymer

The polymer or high molecular weight compound (A) of the invention comprises repeat units having the general formulae (1a) and (1b) in combination.

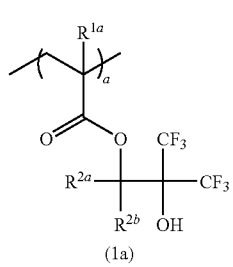

(A)

(1a)

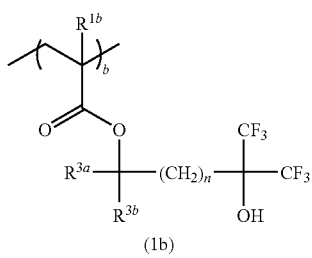

(1b)

Herein $R^{1a}$ and $R^{1b}$ are each independently a hydrogen atom, a fluorine atom or a straight or branched $C_1$-$C_4$ alkyl or fluoroalkyl group. $R^{2a}$, $R^{2b}$, $R^{3a}$ and $R^{3b}$ are each independently a hydrogen atom or a straight, branched or cyclic $C_1$-$C_{20}$ alkyl group. Alternatively, a pair of $R^{2a}$ and $R^{2b}$, and a pair of $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring. The subscripts "a" and "b" are numbers satisfying $0<a<1$, $0<b<1$ and $a+b=1$, and n is an integer of 1 to 4.

In formulae (1a) and (1b), suitable straight or branched $C_1$-$C_4$ alkyl and fluoroalkyl groups represented by $R^{1a}$ and $R^{1b}$ include, but are not limited to, methyl, ethyl, n-propyl, isopropyl, n-butyl, sec-butyl, tert-butyl, trifluoromethyl, 2,2,2-trifluoroethyl, 3,3,3-trifluoropropyl, 2,2,3,3,3-pentafluoropropyl, and 1,1,2,2,3,3,3-heptafluoropropyl.

In formulae (1a) and (1b), suitable straight, branched or cyclic $C_1$-$C_{20}$ alkyl groups represented by $R^{2a}$, $R^{2b}$, $R^{3a}$ and $R^{3b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. When $R^{2a}$ and $R^{2b}$, and $R^{3a}$ and $R^{3b}$ form a ring, each of $R^{2a}$, $R^{2b}$, $R^{3a}$ and $R^{3b}$ is an alkylene group, examples of which include the above-exemplified alkyl groups with one hydrogen atom eliminated. The ring that $R^{2a}$ and $R^{2b}$, or $R^{3a}$ and $R^{3b}$ form with the carbon atom to which they are attached is preferably an aliphatic ring of 4 to 10 carbon atoms, more preferably 5 to 7 carbon atoms.

Illustrative, non-limiting examples of the repeat units of formula (1a) are given below.

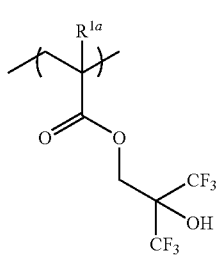

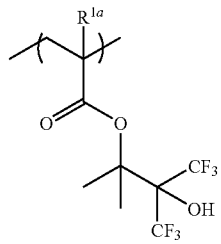

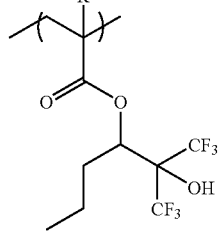

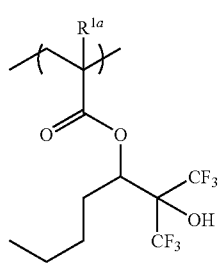

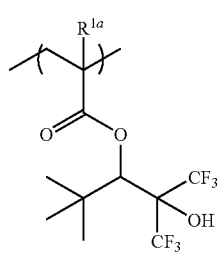

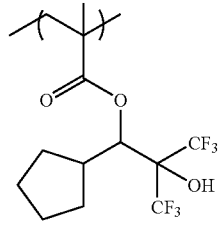

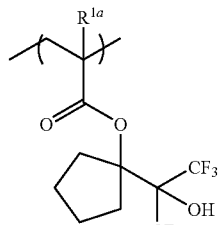

-continued

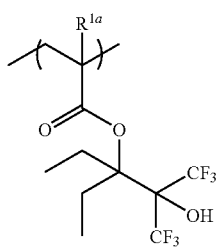

Herein R$^{1a}$ is hydrogen, fluorine or a straight or branched C$_1$-C$_4$ alkyl or fluoroalkyl group.

Illustrative, non-limiting examples of the repeat units of formula (1b) are given below.

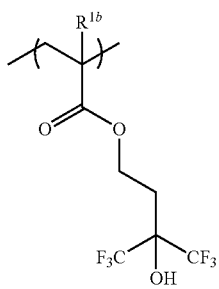

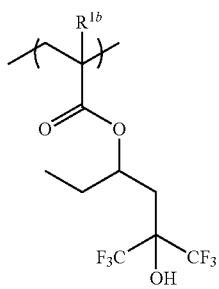

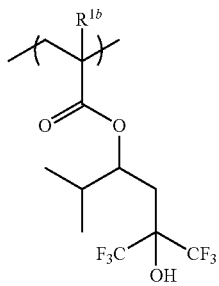

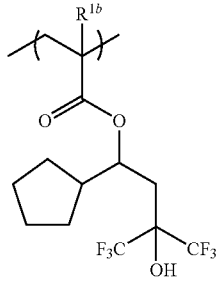

-continued

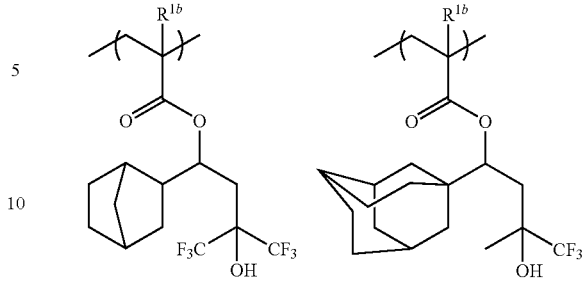

Herein R$^{1b}$ is hydrogen, fluorine or a straight or branched C$_1$-C$_4$ alkyl or fluoroalkyl group.

Resist Protective Coating Material

The resist protective coating material of the invention is characterized by use of a polymer (A1) represented by a combination of repeat units having the general formulae (1a) and (1b).

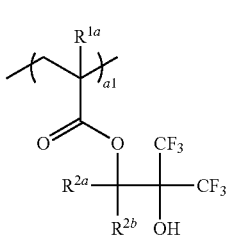

(1a)

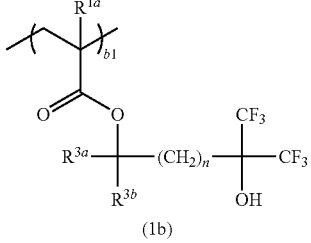

(1b)

Herein R$^{1a}$ and R$^{1b}$ are each independently hydrogen, fluorine or a straight or branched C$_1$-C$_4$ alkyl or fluoroalkyl group. R$^{2a}$, R$^{2b}$, R$^{3a}$ and R$^{3b}$ are each independently hydrogen or a straight, branched or cyclic C$_1$-C$_{20}$ alkyl group.

Alternatively, R$^{2a}$ and R$^{2b}$, and R$^{3a}$ and R$^{3b}$ may bond together to form a ring with the carbon atom to which they are attached, and each of R$^{2a}$, R$^{2b}$, R$^{3a}$ and R$^{3b}$ is a straight, branched or cyclic C$_1$-C$_{20}$ alkylene group when they form a ring. The subscripts "a1" and "b1" are numbers satisfying 0<a1<1, 0<b1<1 and 0<a1+b1≦1, and n is an integer of 1 to 4.

The meaning of a+b=1 or a1+b1=1 is that in a polymer comprising repeat units (1a) and (1b), the total of repeat units (1a) and (1b) is 100 mol % based on the total amount of entire repeat units. In this regard, a molar proportion of repeat units (1a) is preferably from 0.4 to 0.9, and more preferably from 0.5 to 0.85, with the balance being repeat units (1b).

The meaning of a1+b1<1 is that the total of repeat units (1a) and (1b) is less than 100 mol % based on the total amount of entire repeat units, indicating the inclusion of other repeat units. In this regard, the sum of a1+b1 is preferably at least 0.5, and more preferably at least 0.7. Other repeat units include repeat units having formulae (2) to (5), shown later. The relative proportion of repeat units (1a) and (1b) is the same as above.

In formulae (1a) and (1b), suitable straight or branched $C_1$-$C_4$ alkyl and fluoroalkyl groups represented by $R^{1a}$ and $R^{1b}$ include, but are not limited to, methyl, ethyl, n-propyl, isopropyl, n-butyl, sec-butyl, tert-butyl, trifluoromethyl, 2,2,2-trifluoroethyl, 3,3,3-trifluoropropyl, 2,2,3,3,3-pentafluoropropyl, and 1,1,2,2,3,3,3-heptafluoropropyl.

In formulae (1a) and (1b), suitable straight, branched or cyclic $C_1$-$C_{20}$ alkyl groups represented by $R^{2a}$, $R^{2b}$, $R^{3a}$ and $R^{3b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. When $R^{2a}$ and $R^{2b}$, and $R^{3a}$ and $R^{3b}$ form a ring, each of $R^{2a}$, $R^{2b}$, $R^{3a}$ and $R^{3b}$ is an alkylene group, examples of which include the above-exemplified alkyl groups with one hydrogen atom eliminated. The ring that $R^{2a}$ and $R^{2b}$, or $R^{3a}$ and $R^{3b}$ form with the carbon atom to which they are attached is preferably an aliphatic ring of 4 to 10 carbon atoms, more preferably 5 to 7 carbon atoms.

The polymer (A1) used in the resist protective coating material of the invention essentially contains both repeat units of formulae (1a) and (1b). The repeat units of formula (1a) are soluble in an alkaline developer, and even their copolymers with a methacrylic acid ester having a fluoroalkyl group on side chain (e.g., 1H,1H,5H-octafluoropentyl methacrylate) can exert the function of alkali-soluble protective coating material. However, this system has an increased static contact angle after development, leading to a strong likelihood of blob defects as mentioned above. In contrast, the repeat units of formula (1b) are difficultly soluble in an alkaline developer, but effective in improving water slip properties such as sliding angle and receding contact angle and do not increase the static contact angle after development, leading to a minimal likelihood of blob defects. Then the inventive polymer (A1), which is formed by combining both repeat units of formulae (1a) and (1b), provides an alkali-soluble protective coating material having improved water slip and minimized blob defects.

Although the polymer (A1) used in the resist protective coating material of the invention exerts its performance to a full extent by merely combining both repeat units of formulae (1a) and (1b), it may be further combined with repeat units of one or more types selected from the general formulae (2) to (5) shown below, for the purpose of imparting further water repellency or water slip or controlling developer affinity.

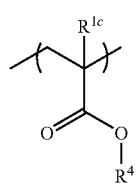

(2)

-continued

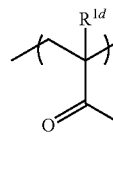

(3)

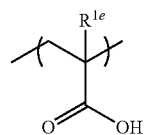

(4)

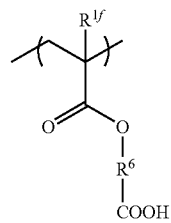

(5)

Herein $R^{1c}$, $R^{1d}$, $R^{1e}$, and $R^{1f}$ are each independently a hydrogen atom, a fluorine atom or a straight or branched $C_1$-$C_4$ alkyl or fluoroalkyl group. $R^4$ is a $C_2$-$C_{10}$ fluoroalkyl group. $R^5$ is an adhesive group. $R^6$ is a divalent organic group of 1 to 20 carbon atoms.

In formulae (2) to (5), suitable straight or branched $C_1$-$C_4$ alkyl and fluoroalkyl groups represented by $R^{1c}$ to $R^{1f}$ include, but are not limited to, methyl, ethyl, n-propyl, isopropyl, n-butyl, sec-butyl, tert-butyl, trifluoromethyl, 2,2,2-trifluoroethyl, 3,3,3-trifluoropropyl, 2,2,3,3,3-pentafluoropropyl, and 1,1,2,2,3,3,3-heptafluoropropyl.

Suitable $C_2$-$C_{10}$ fluoroalkyl groups represented by $R^4$ include, but are not limited to, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

The adhesive group represented by $R^5$ is selected from a variety of such groups, with those groups of the formulae shown below being preferred.

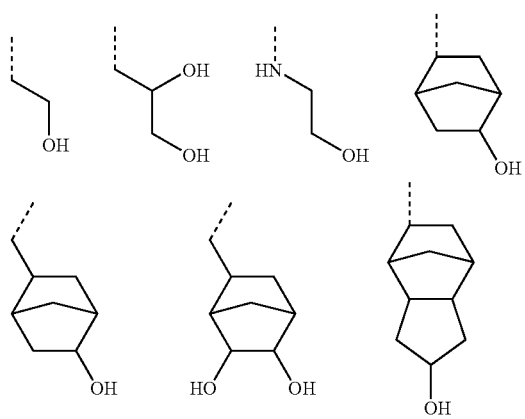

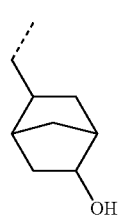
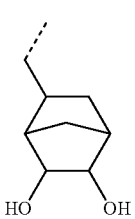
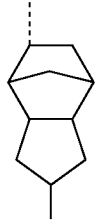

-continued
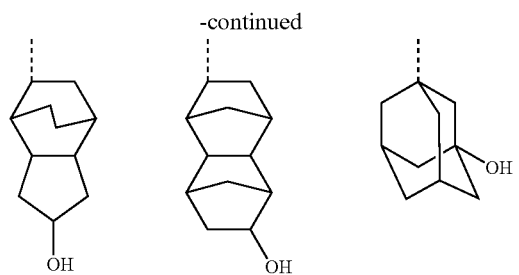
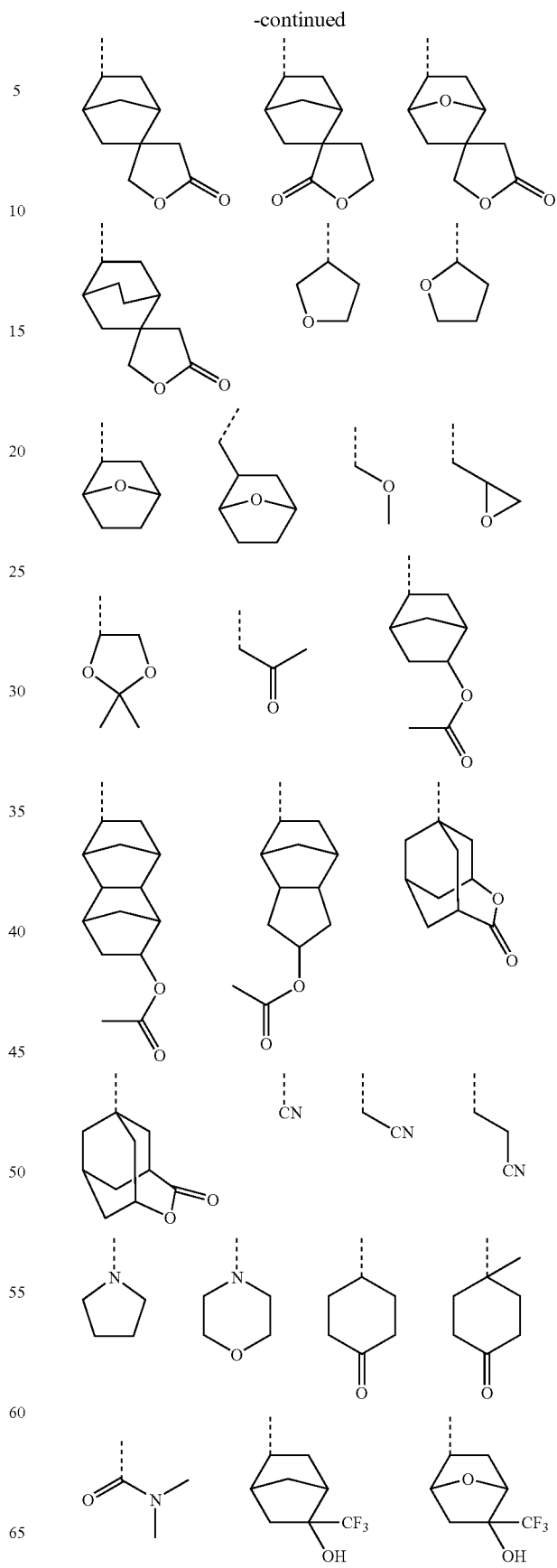

-continued

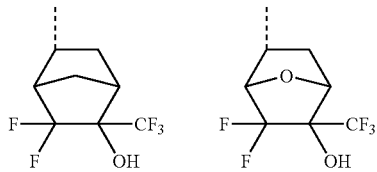

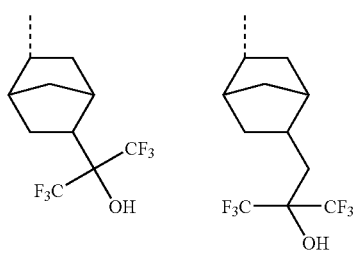

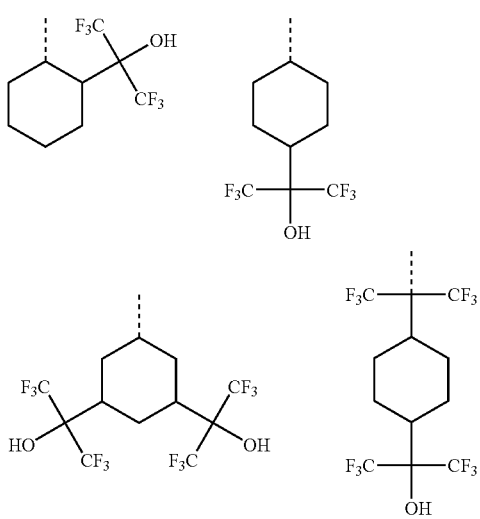

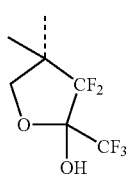

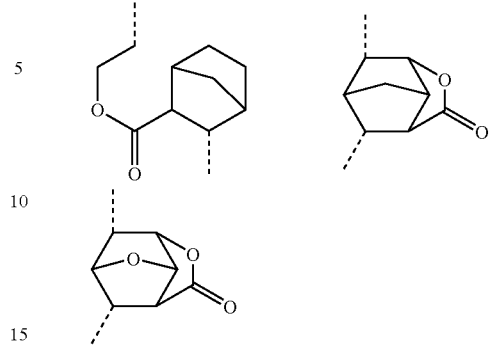

The polymers may be synthesized by general polymerization processes including radical copolymerizataion using initiators such as 2,2'-azobisisobutyronitrile (AIBN), ionic (or anionic) polymerization using alkyllithium, and the like. The polymerization may be carried out by its standard technique. Preferably the polymers are prepared by radical polymerization while the polymerization conditions may be determined in accordance with the type of initiator, temperature, pressure, concentration, solvent, additives, and the like.

Examples of the radical initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), dimethyl 2,2'-azobis(isobutyrate); peroxides such as tert-butylperoxypivalate, lauroyl peroxide, benzoyl peroxide, tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 5 mol % based on the total moles of monomers to be polymerized.

During the synthesis of the inventive polymer, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

If necessary, a solvent may be used during the synthesis of the inventive polymer. Any solvent may be used as long as it does not interfere with the desired polymerization reaction. Examples of suitable organic solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably 20 to 200° C., and In these formulae and throughout the specification, a broken line denotes a valence bond.

Suitable divalent organic groups represented by $R^6$ include $C_1$-$C_{20}$, especially $C_1$-$C_8$ alkylene groups, such as methylene as well as groups of the following formulae.

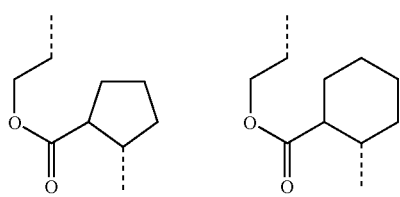

more preferably 50 to 140° C. Any desired reactor or vessel may be used for the polymerization reaction.

From the solution or dispersion of the polymer thus synthesized, the organic solvent or water serving as the reaction medium is removed by any of well-known techniques. Suitable techniques include, for example, re-precipitation followed by filtration, and heat distillation under vacuum.

Desirably the polymer has a weight average molecular weight (Mw) of about 1,000 to about 500,000, and especially about 2,000 to about 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In the polymers of the invention wherein U1 stands for a total molar number of monomers corresponding to units of formula (1a) and U2 stands for a total molar number of monomers corresponding to units of formula (1b), with the proviso that U1+U2=U, a proportion of U1 and U2 is preferably determined so as to meet:

0<U1/U<1.0, more preferably $0.4 \leq U1/U \leq 0.9$, even more preferably $0.5 \leq U1/U < 0.85$, and 0<U2/U<1.0, more preferably $0.1 \leq U2/U$ 0.6, even more preferably $0.15 \leq U2/U \leq 0.5$.

In the embodiment wherein repeat units of formulae (2) to (5) are incorporated into the polymers for the purpose of improving their function as a base polymer in the resist protective coating material, provided that U1' stands for a total molar number of monomers corresponding to units of formula (1a), U2' stands for a total molar number of monomers corresponding to units of formula (1b), U3' stands for a total molar number of monomers corresponding to units of formula (2), U4' stands for a total molar number of monomers corresponding to units of formula (3), U5' stands for a total molar number of monomers corresponding to units of formula (4) or (5), and $$U1'+U2'+U3'+U4'+U5'=U',$$

a proportion of U1' to U5' is preferably determined so as to meet:

0<U1'/U'<1.0, more preferably $0.4 \leq U1'/U' \leq 0.9$,
0<U2'/U'<1.0, more preferably $0.1 \leq U2'/U' \leq 0.6$,
$0 \leq U3'/U' \leq 0.7$, more preferably $0 \leq U3'/U' < 0.4$,
$0 \leq U4'/U' \leq 0.7$, more preferably $0 \leq U4'/U' \leq 0.4$, and
$0 \leq U5'/U' \leq 0.7$, more preferably $0 \leq U5'/U' \leq 0.4$.

The polymer is used as a base resin in a protective coating material for immersion lithography. At this point, the inventive polymer may be admixed with another polymer for the purposes of altering the dynamic, thermal, alkali solubility, water repellency, water slip and other physical properties of the resulting film. The range of other polymers which can be admixed is not particularly limited, and any of polymers well known in the resist and topcoat applications may be admixed in any desired amount.

In the practice of the invention, the polymer is dissolved in a suitable solvent to form a solution which is ready for use as the resist protective coating material. For film formation by spin coating technique, the solvent is preferably used in such amounts to provide a concentration of 0.1 to 20% by weight, more preferably 0.5 to 10% by weight of the polymer.

The solvent used herein is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane and ethers. Of these, higher alcohols of at least 4 carbon atoms, more specifically 4 to 8 carbon atoms and ether compounds of 8 to 20 carbon atoms, more specifically 8 to 12 carbon atoms are most desirable. Examples of suitable solvents include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol as well as diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether. These solvents may be used alone or in admixture.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro (1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Where the protective coating material is of developer soluble type, an amine compound may be added to the protective coating material for avoiding a phenomenon that the top profile of a resist film is rounded or suppressing a decline of side-lobe margin of a hole pattern.

In the photoresist material, an amine compound is added for the purposes of controlling acid diffusion, improving contrast, and controlling sensitivity. Carboxyl groups and hexafluoroalcohol groups serving as the alkali soluble group in the topcoat generally have a high affinity to the amine compounds. Therefore, if a developer soluble topcoat is applied onto a photoresist layer, part of the amine compound in the resist layer will migrate to the topcoat layer, so that the resist layer has a lower amine concentration near its interface with the topcoat. As a result, the acid diffusion in the resist layer becomes excessive whereby the resist top portion is dissolved, leading to a slimming of the film. One means for restraining such migration of amine compound is to reduce the acidity of alkali soluble groups (e.g., carboxyl groups and hexafluoroalcohol groups), which is accompanied by an extreme drop of alkali dissolution rate. Effective means for restraining migration of the amine compound without a drop of alkali dissolution rate is the addition of amine compound to the protective coating material, as described just above.

The amine compound which is added to the protective coating material must meet some requirements including (1) no absorption to ArF light, (2) a boiling point of at least 200° C. under atmospheric pressure to prevent evaporation during prebaking, (3) low leaching in water, and (4) basicity. In view of the requirement that the compound is not absorptive at wavelength 193 nm, aromatic compounds, unsaturated bond-bearing compounds, and amide group-bearing compounds are excluded. In view of the water-insoluble requirement, glyme chain-bearing compounds, primary amines, secondary amines, quaternary ammonium salts and analogs are excluded. In contrast, tertiary alkyl amines are advantageously used. Tertiary amine compounds having a fluoroalkyl group may be modified to be not leachable in water at all. Suitable tertiary amine compounds have the general formula (B-1).

Herein $R_b^1$, $R_b^2$, and $R_b^3$ each are a straight, branched or cyclic $C_1$-$C_{30}$ alkyl group which may contain an ester, ether or amino group, or a pair of $R_b^1$ and $R_b^2$, $R_b^1$ and $R_b^3$, or $R_b^2$ and $R_b^3$ may bond together to form a ring with the nitrogen atom to which they are attached, which ring may contain an ester, ether or amino group. The alkyl group may be partially or entirely substituted with fluorine.

Examples of amine compounds having formula (B-1) include, but are not limited to, trimethylamine, triethylamine, tri-n-propylamine, triisopropylamine, tri-n-butylamine, tri-isobutylamine, tri-sec-butylamine, tripentylamine, tricyclopentylamine, trihexylamine, tricyclohexylamine, triheptylamine, trioctylamine, trinonylamine, tridecylamine, tridodecylamine, trioctylamine, N,N-dimethylcyclohexylamine, N,N-diethylcyclohexylamine, N,N-dibutylcyclohexylamine, N,N,N',N'-tetramethylmethylenediamine, N,N,N',N'-tetramethylethylenediamine, N,N,N',N'-tetramethyltetraethylenepentamine, dimethylethylamine, and methylethylpropylamine.

Since the addition of a tertiary alkylamine compound can adversely affect the water repellency of an immersion lithography protective coating material, the amount of the amine compound added is desirably equal to or less than 5 parts, more desirably equal to or less than 2 parts, and even more desirably equal to or less than 1 parts by weight per 100 parts by weight of the base resin in the protective coating material. The smaller the addition amount, the less becomes the effect of reducing water slip. Also for preventing a lowering of water slip, addition of amine compounds having a long-chain alkyl group of at least 4 carbon atoms is preferred.

Also, amine compounds having an ester or ether group represented by the following formula (B-2) are effective in improving the rectangularity of patterns, even when added in small amounts. Since these amine compounds have a good acid trapping ability, they have advantages that they assist in improving the contrast and producing rectangular patterns when added to resist materials (see JP-A 11-84639, JP-A 2001-194776 and JP-A 2002-226470), and that they are effective in suppressing a slimming of the resist pattern when added to resist protective coating materials.

$$N(X)_n(Y)_{3-n} \quad (B-2)$$

Herein n is equal to 1, 2 or 3. The side chain X, which may be the same or different, is independently selected from groups of the general formulas (X)-1 to (X)-3. Two or three X's may bond together to form a ring. The side chain Y, which may be the same or different, is independently a straight, branched or cyclic $C_1$-$C_{30}$ alkyl group. $R^{300}$, $R^{302}$ and $R^{305}$ are independently straight or branched $C_1$-$C_4$ alkylene groups; $R^{301}$ and $R^{304}$ are independently straight, branched or cyclic $C_1$-$C_{30}$ alkyl groups which may contain fluorine atoms; $R^{303}$ is a single bond or a straight or branched $C_1$-$C_4$ alkylene group; $R^{306}$ is a straight, branched or cyclic $C_1$-$C_{30}$ alkyl group which may contain fluorine atoms.

Illustrative examples of the compounds of formula (B-2) are given below, but not limited thereto.

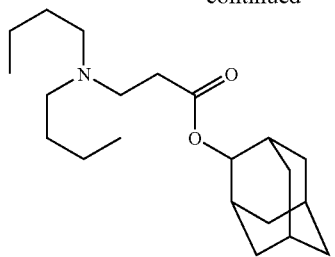

-continued

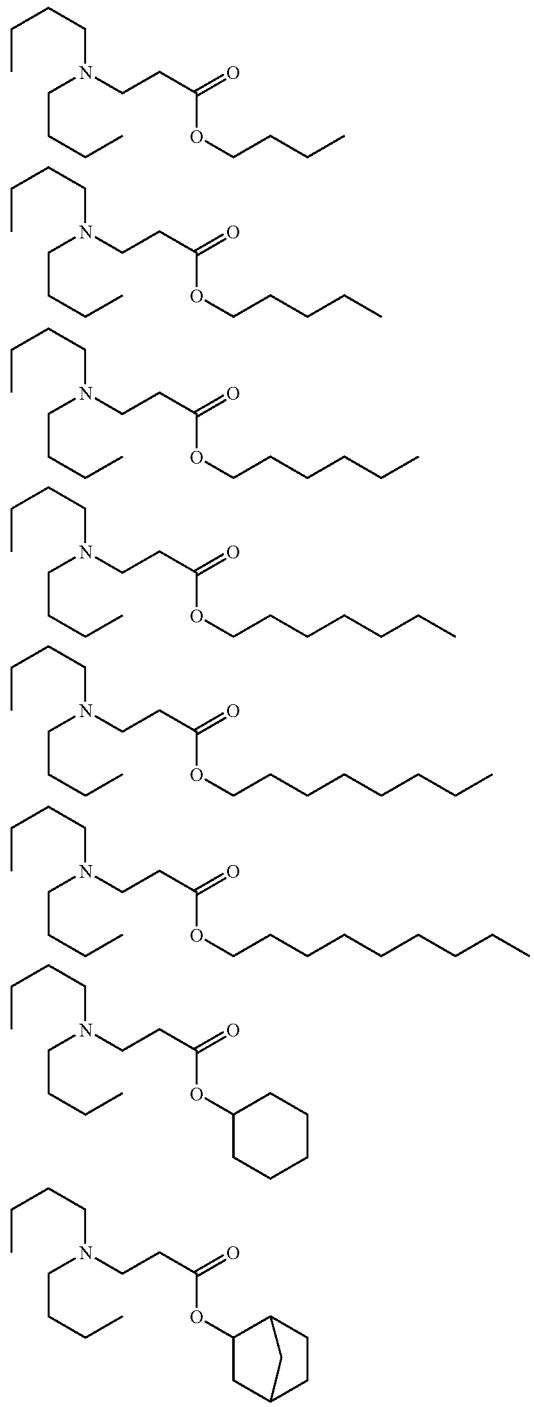

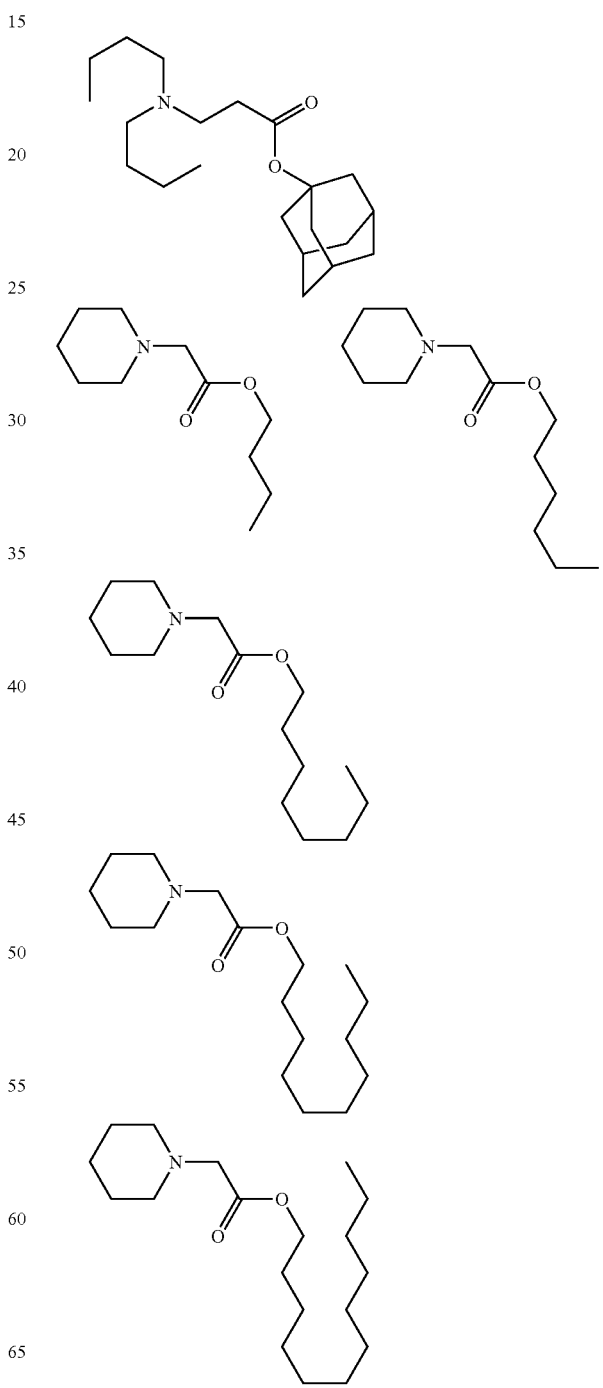

-continued
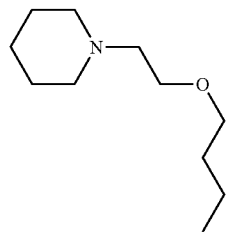
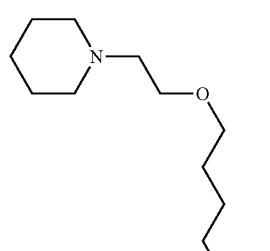
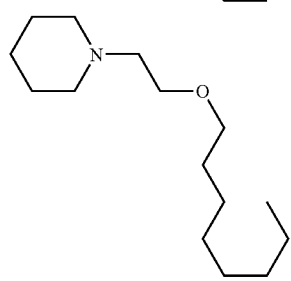
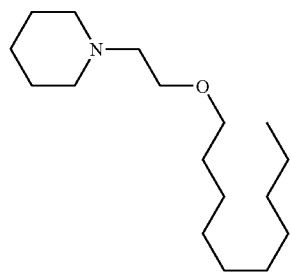
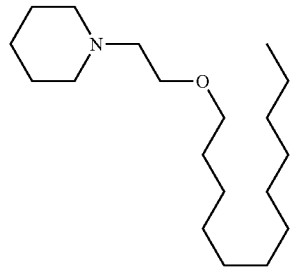
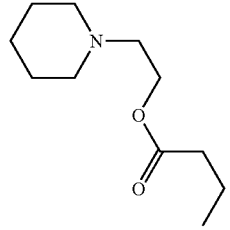
-continued
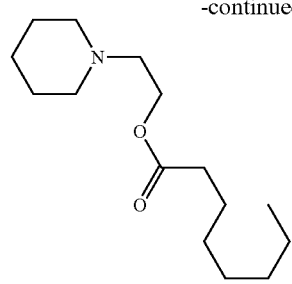
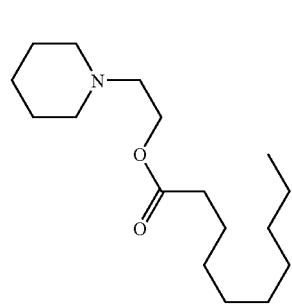
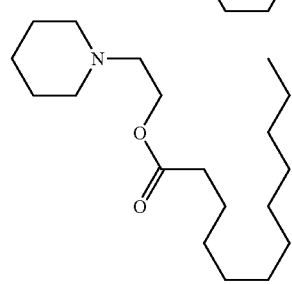
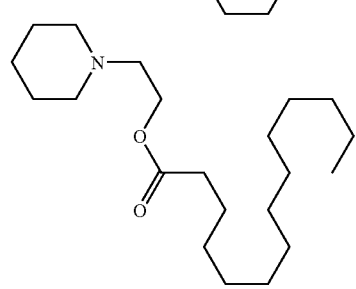
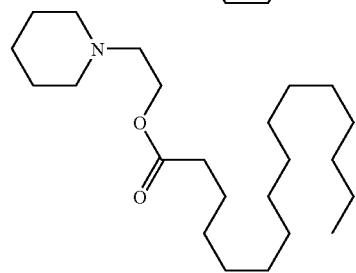
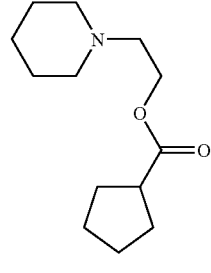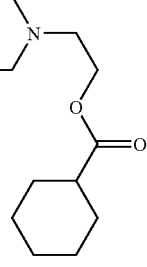

-continued
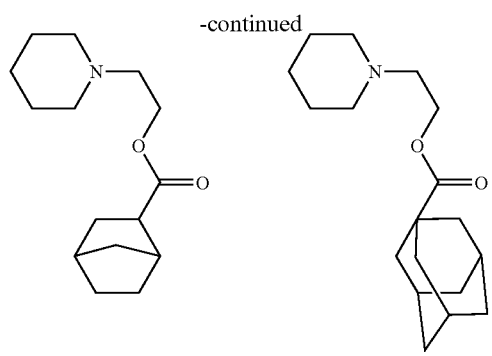
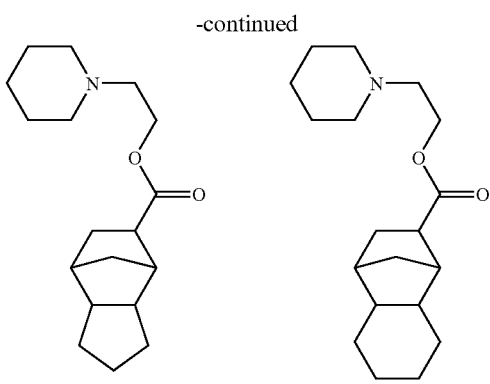
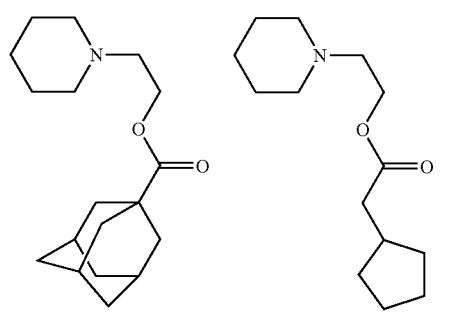
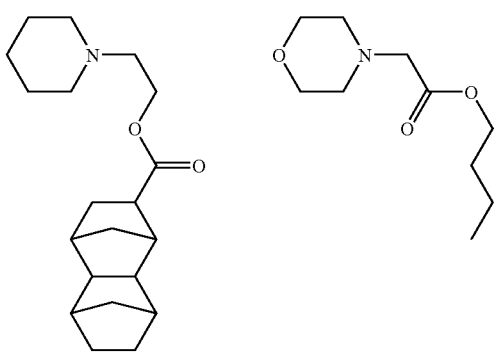
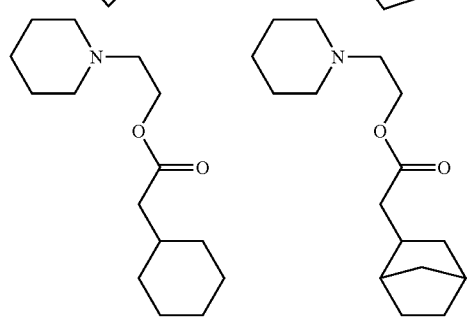
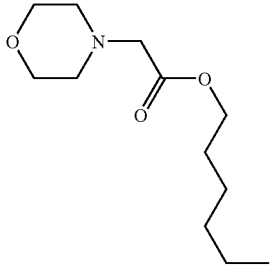
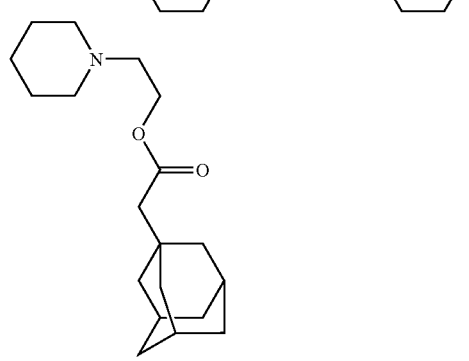
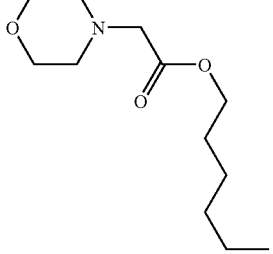
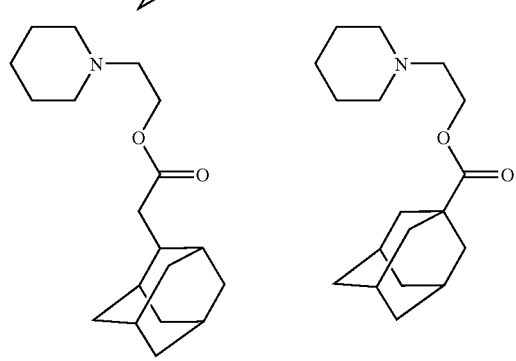
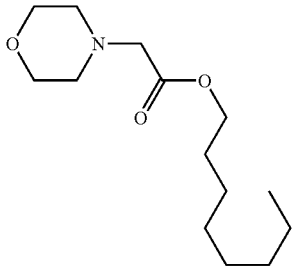

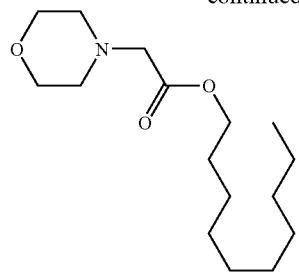
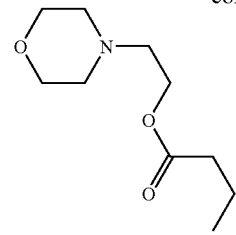
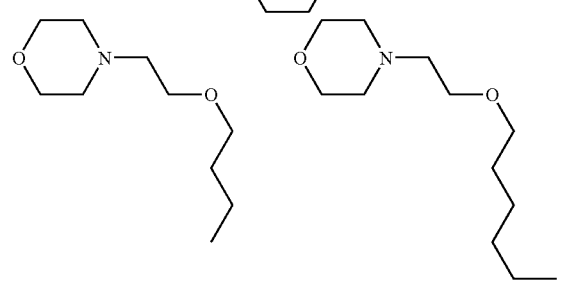
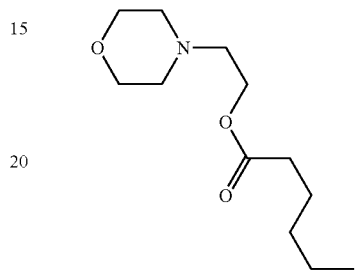
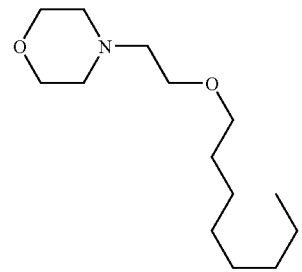
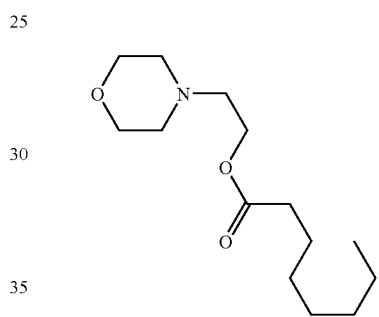
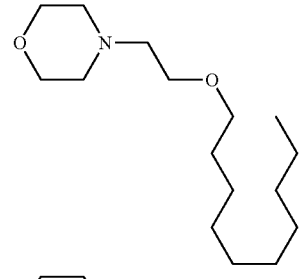
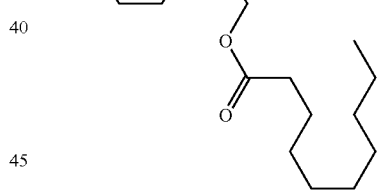
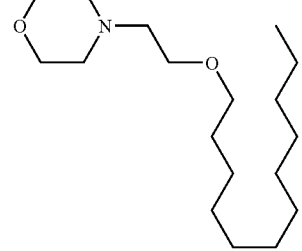
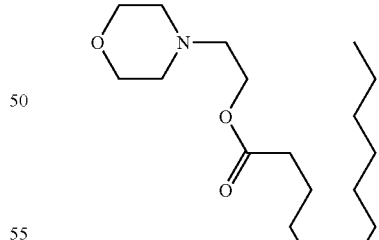
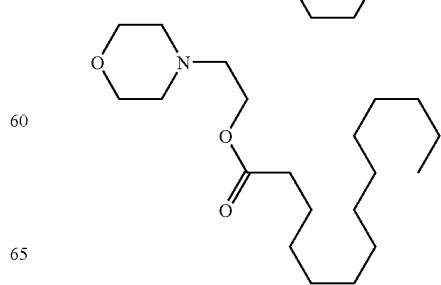

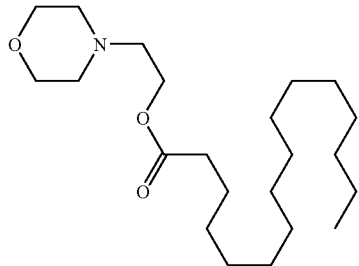
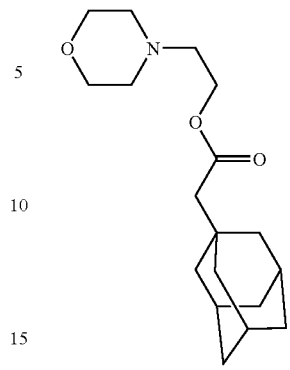
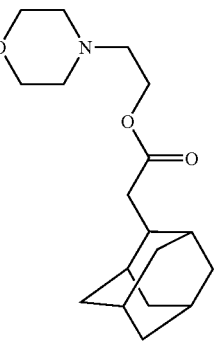
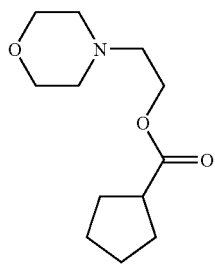
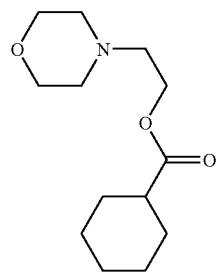
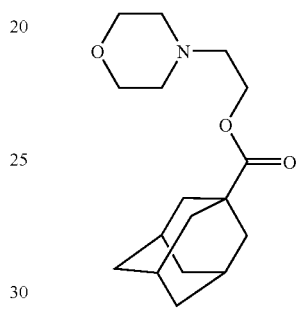
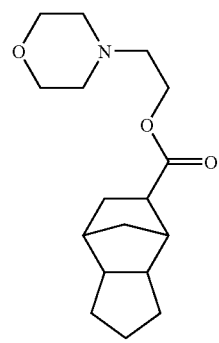
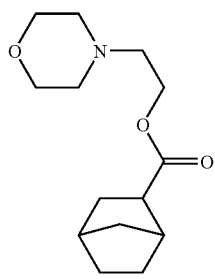
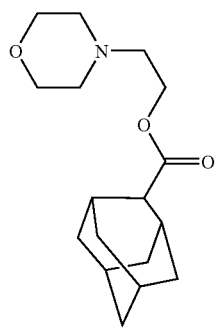
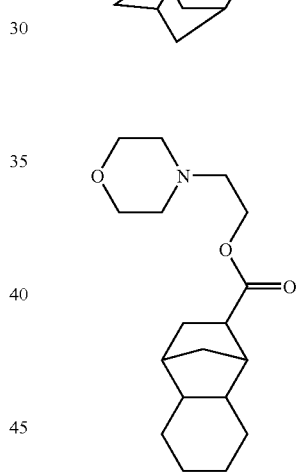
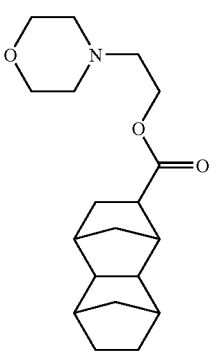
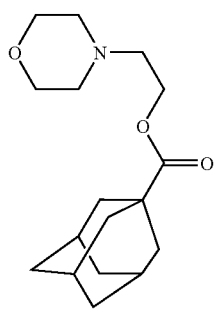
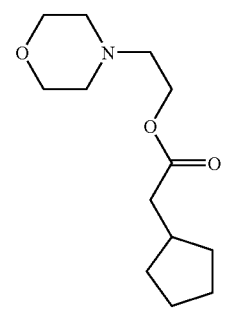
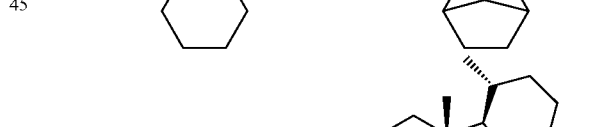
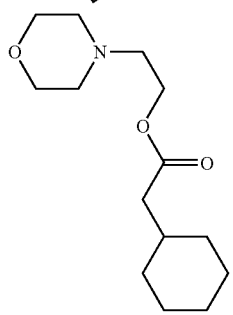
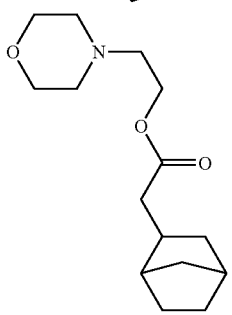
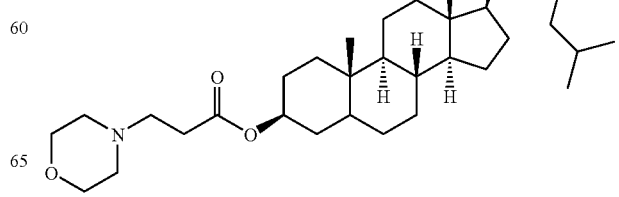

-continued
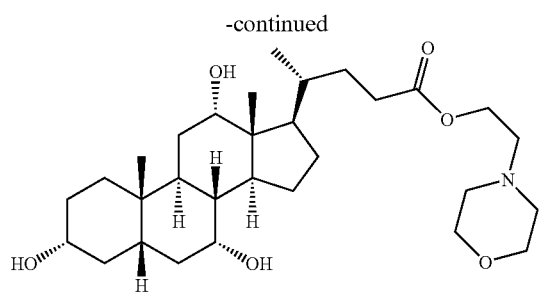
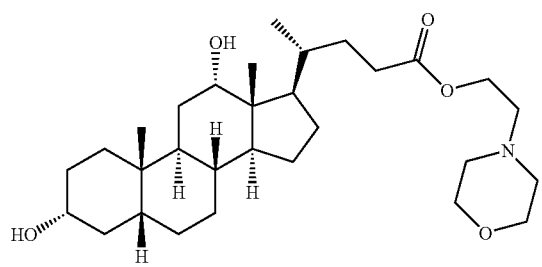
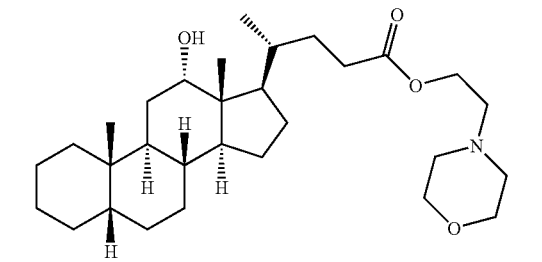
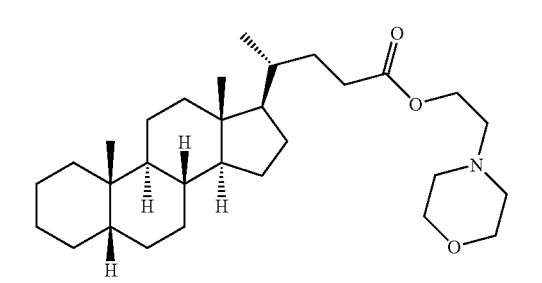
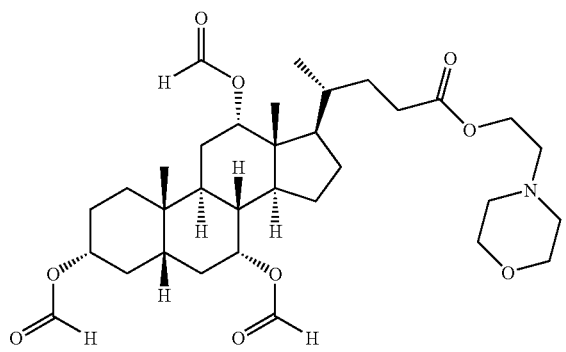
-continued
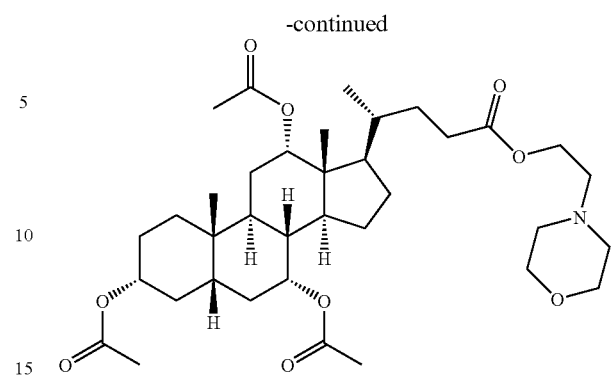
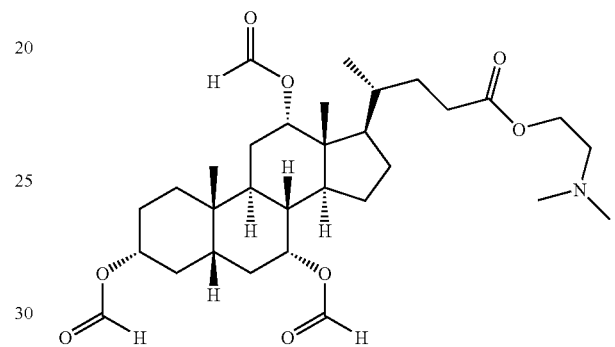
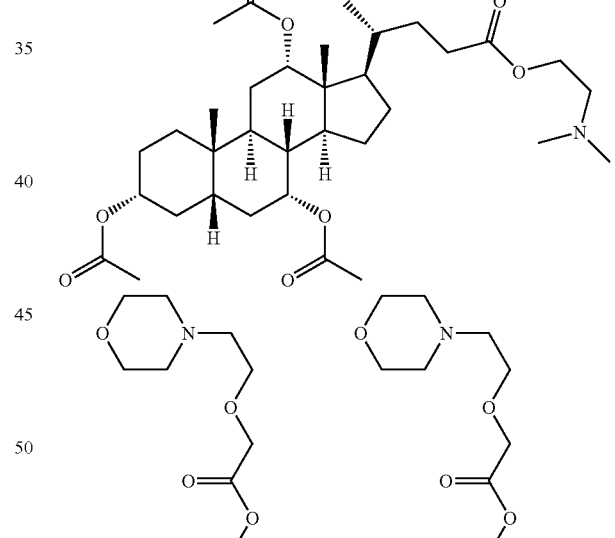
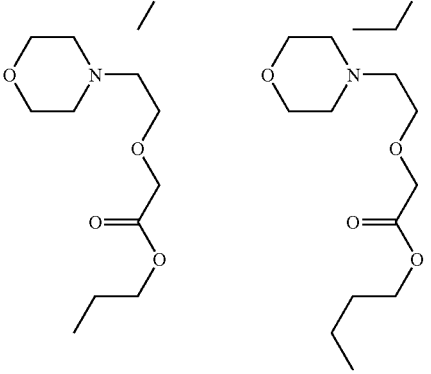

-continued
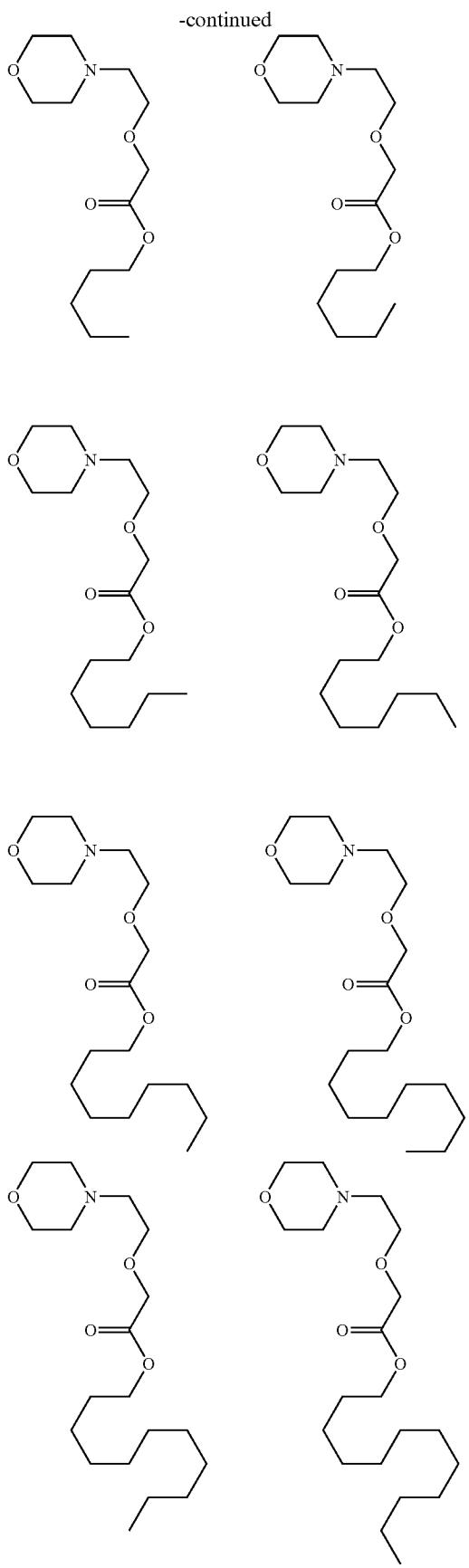
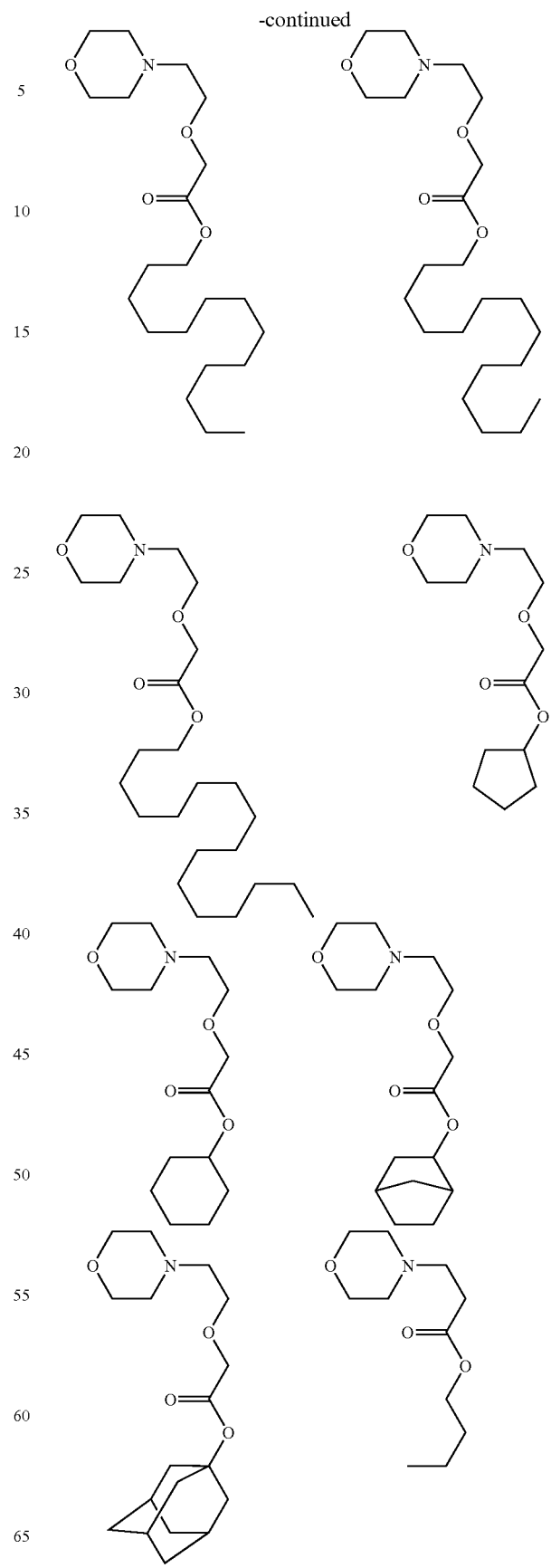

-continued
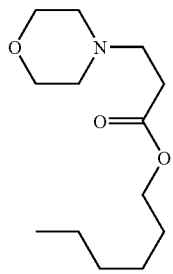 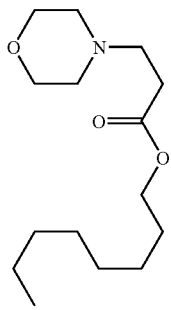 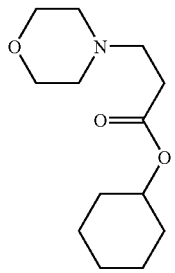 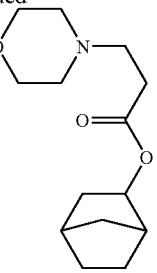
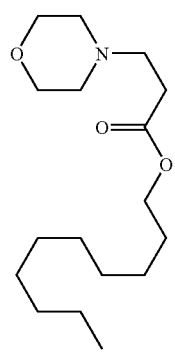 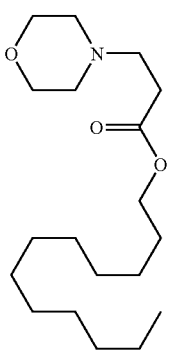 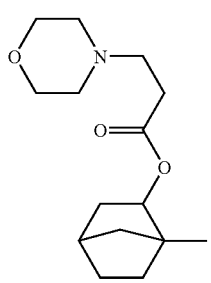 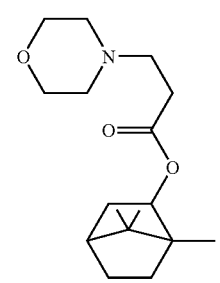
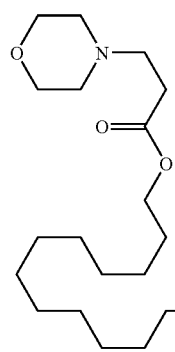 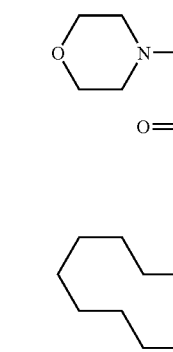 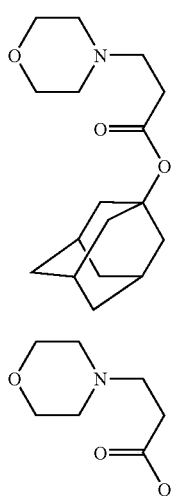 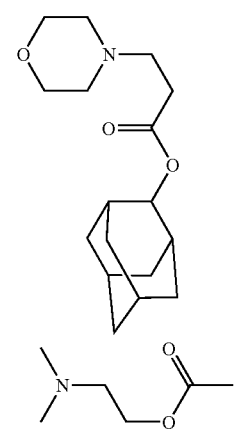
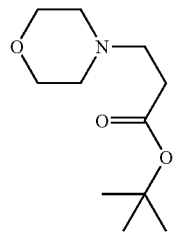 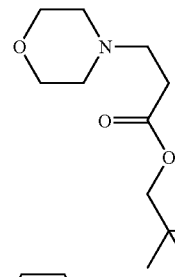 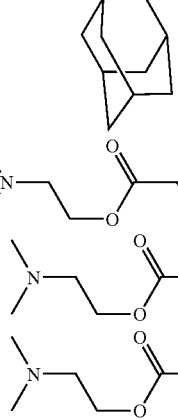 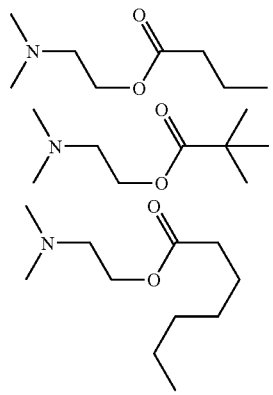
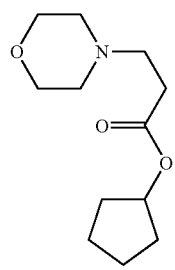 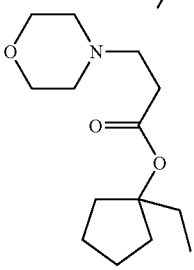

-continued
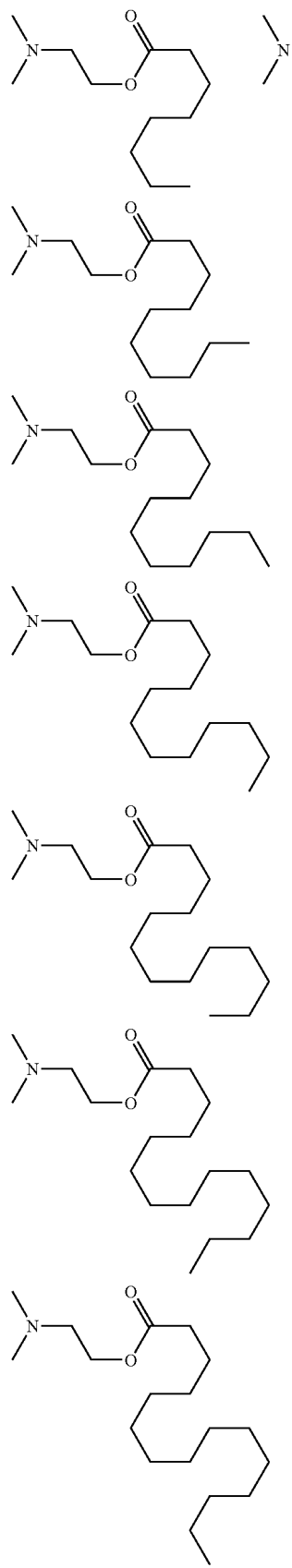
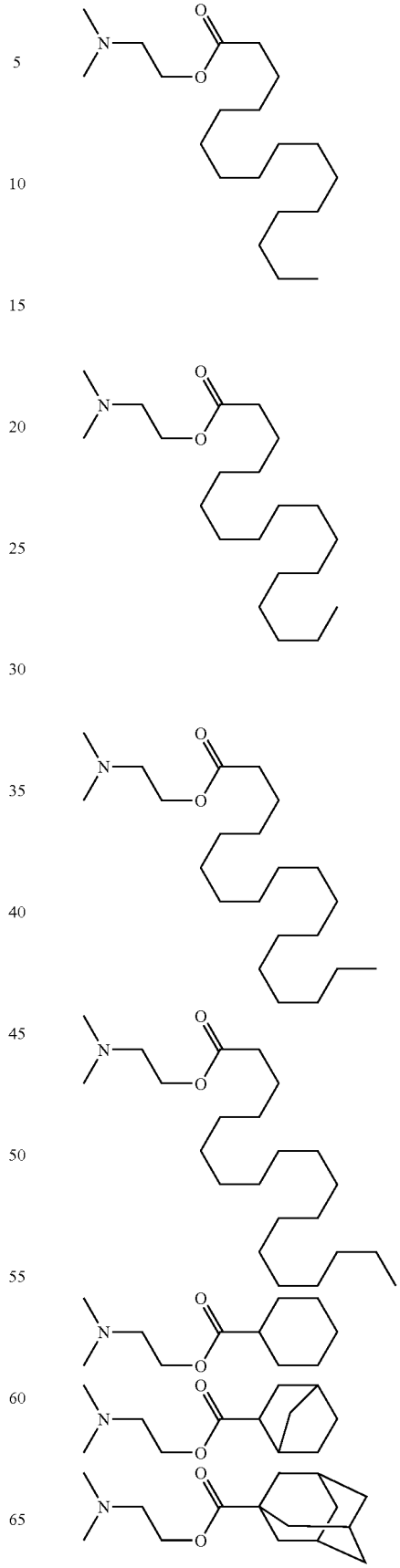

-continued
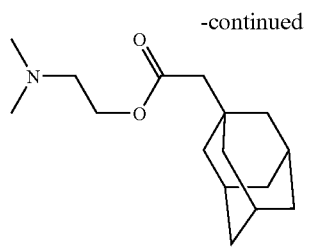
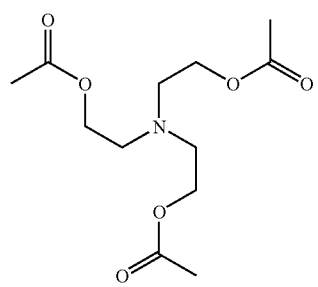
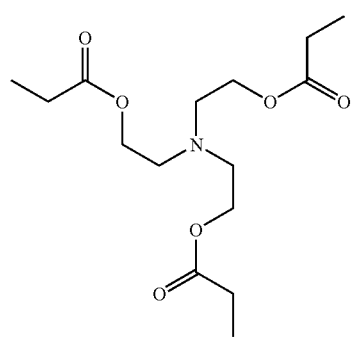
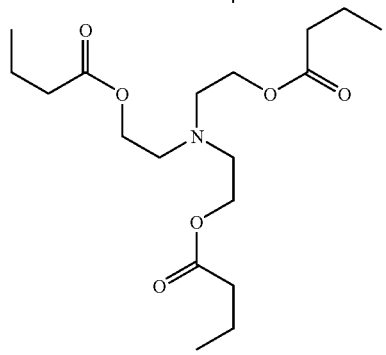
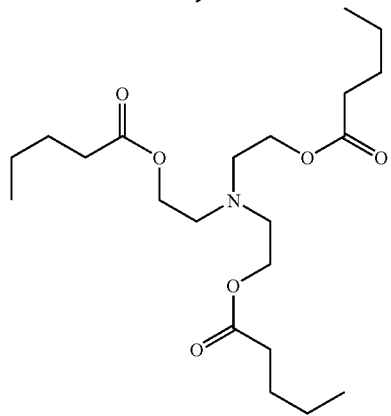
-continued
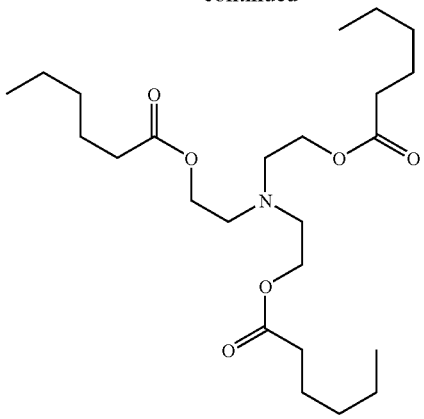
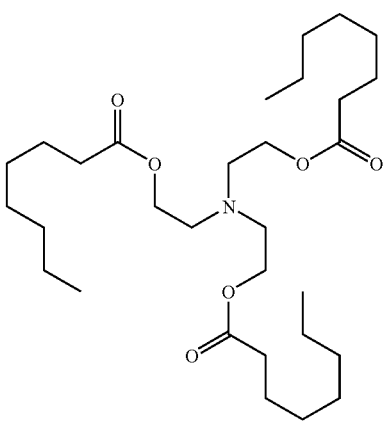

-continued
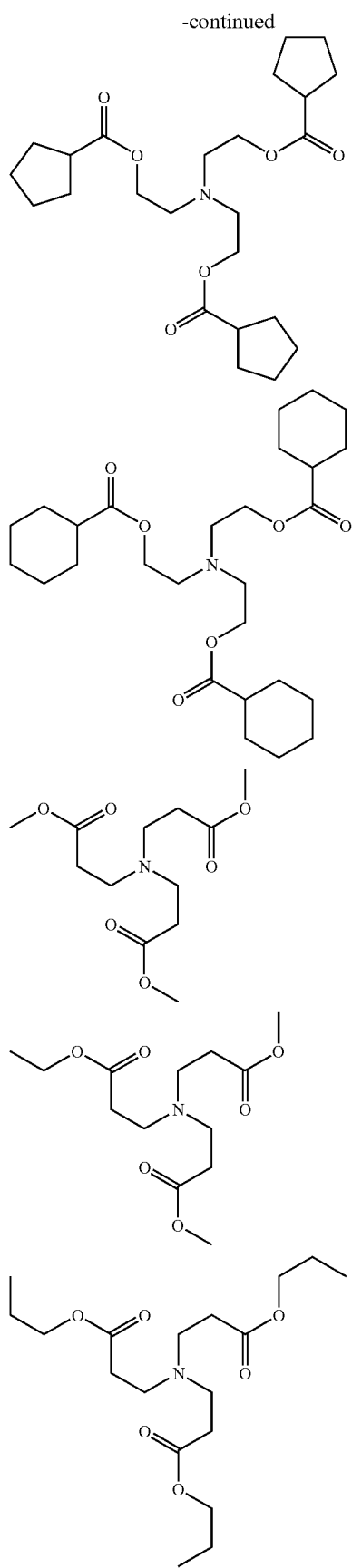
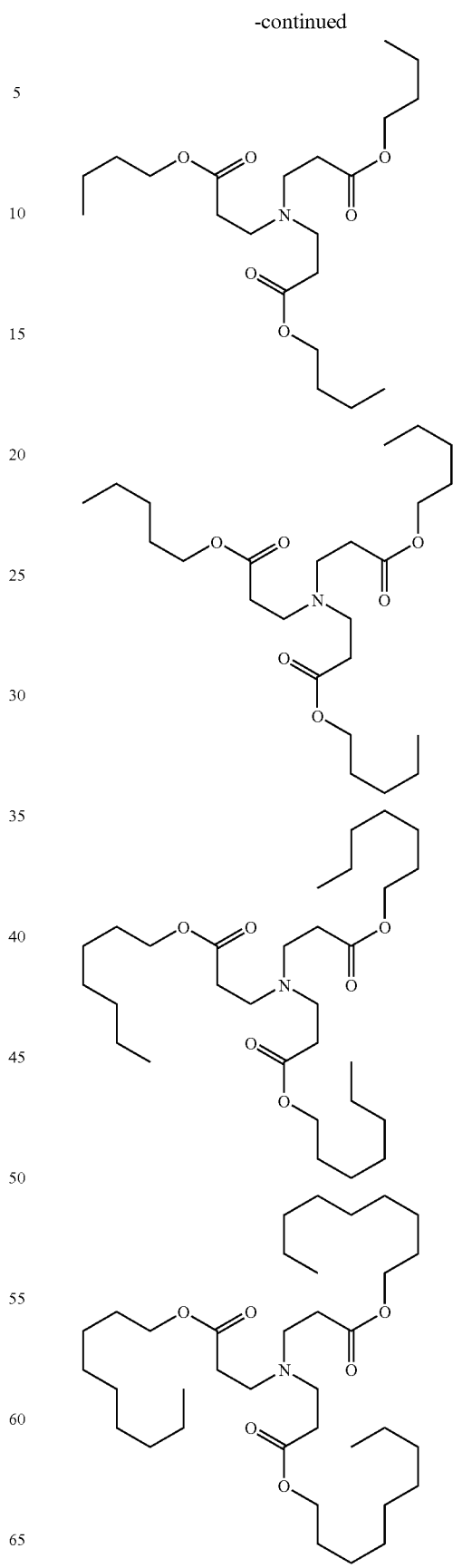

-continued
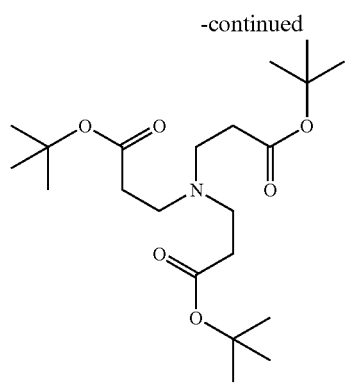
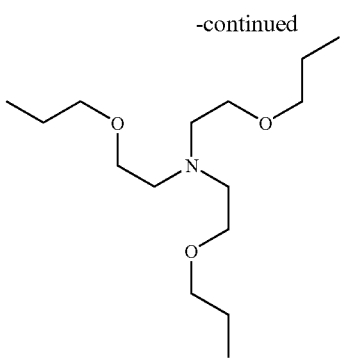
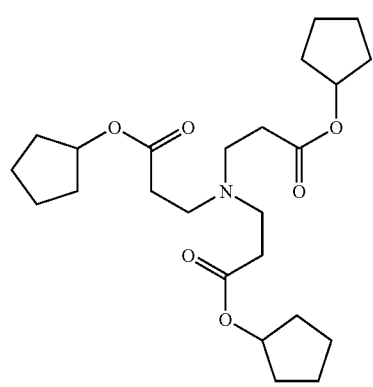
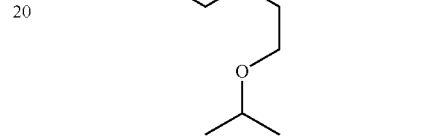
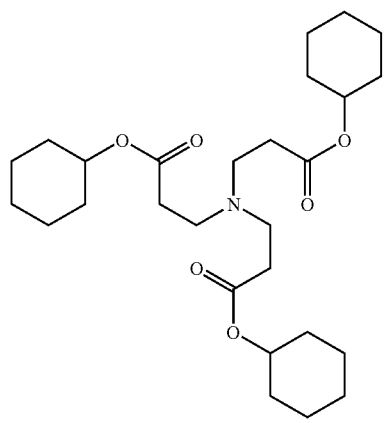
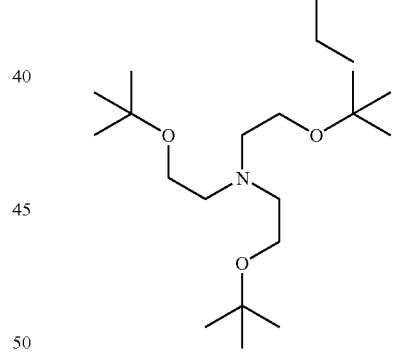
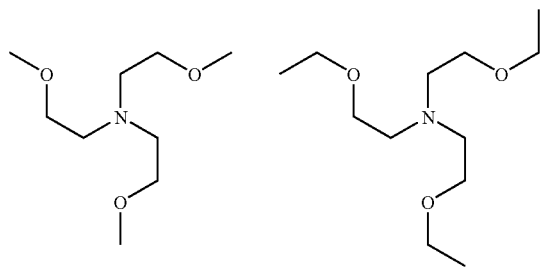
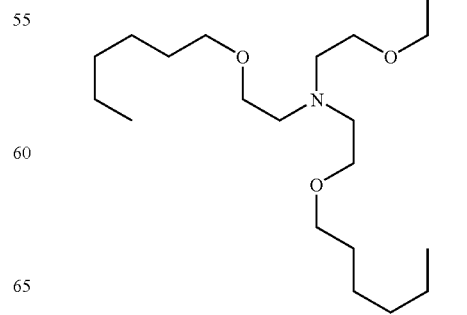

-continued
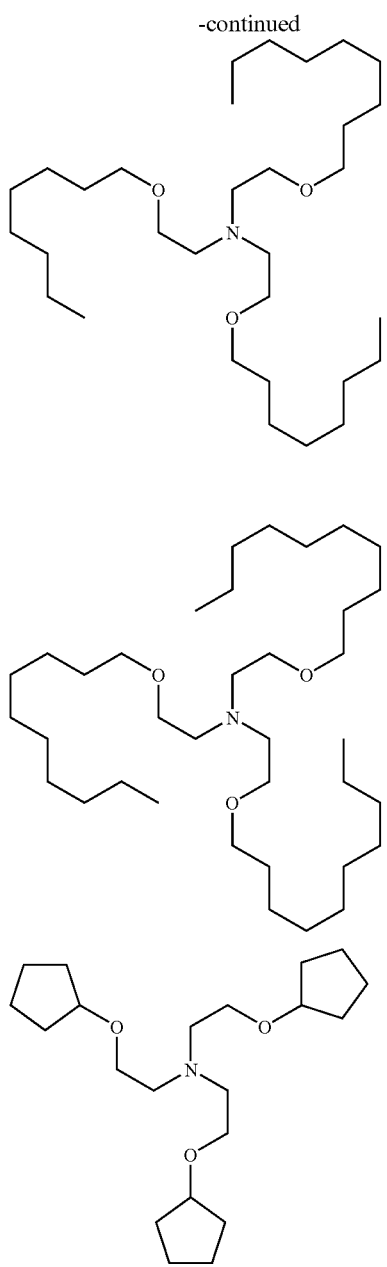
Illustrative examples of amine compounds having a fluoroalkyl group are given below, but not limited thereto. With respect to their synthesis, reference should be made to US 20070087287A1 or JP-A 2007-108451.
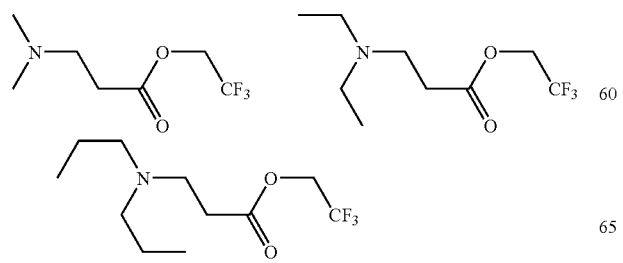
-continued
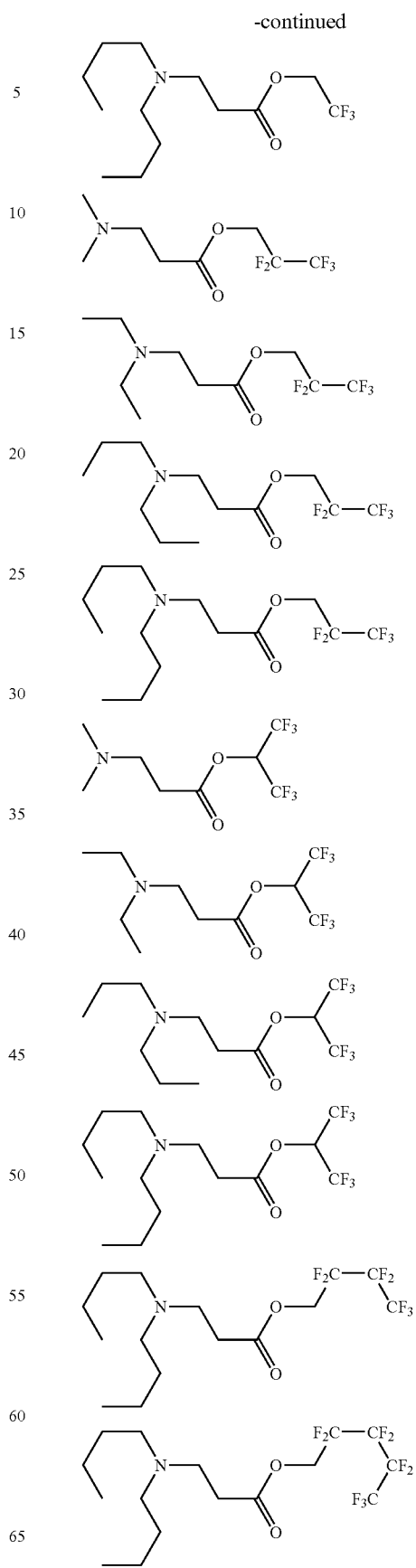

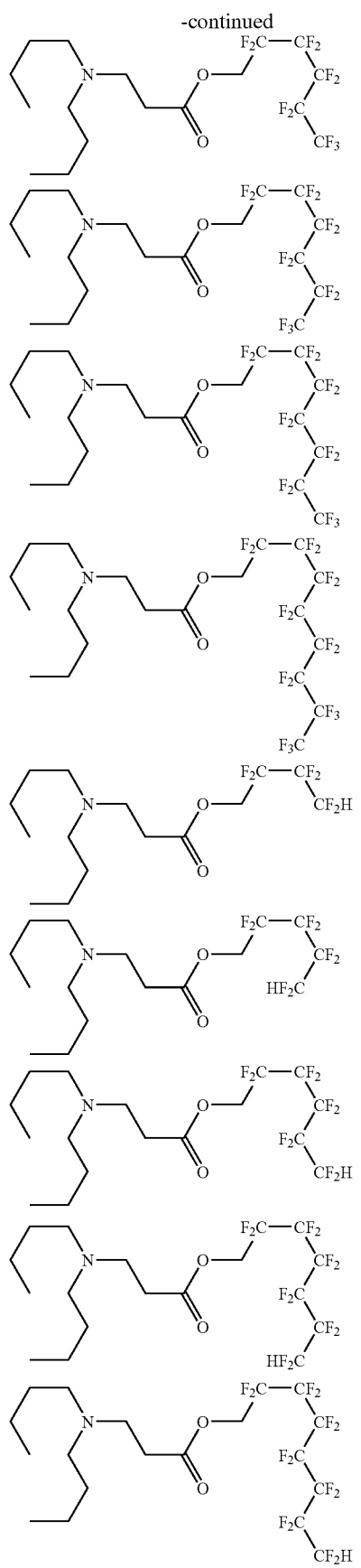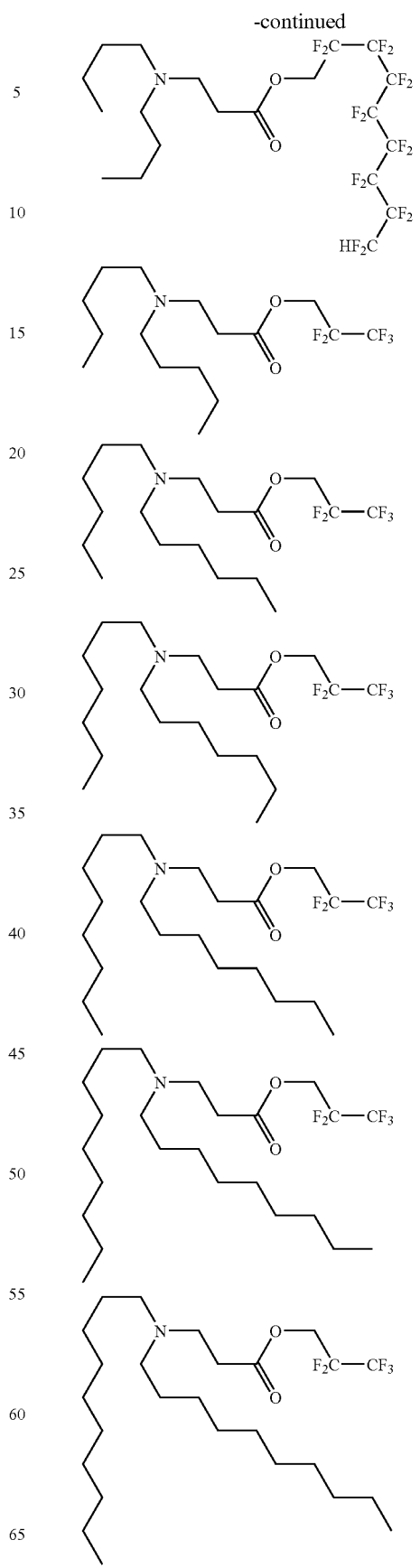

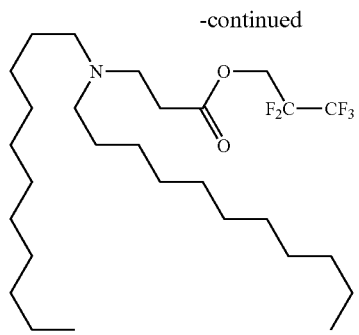
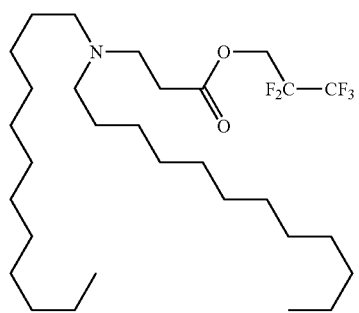
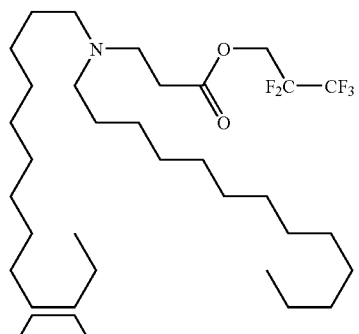
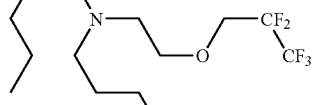
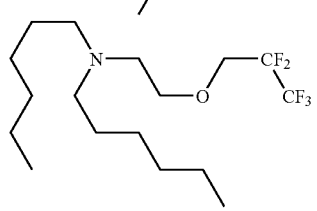
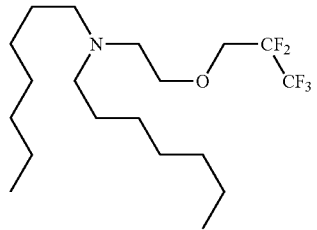
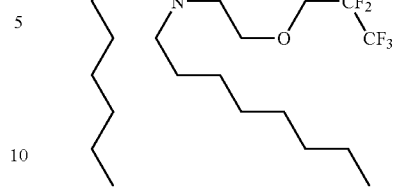
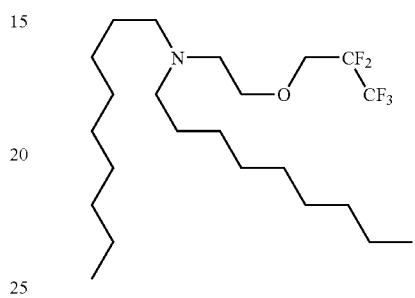
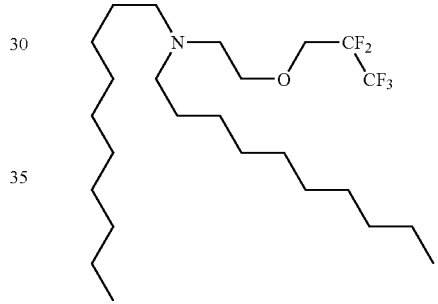
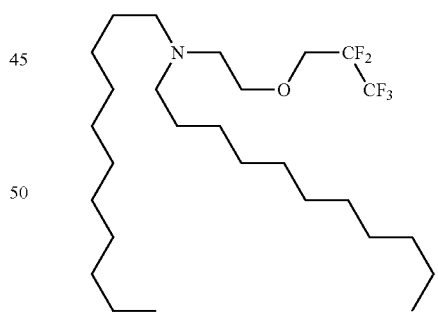
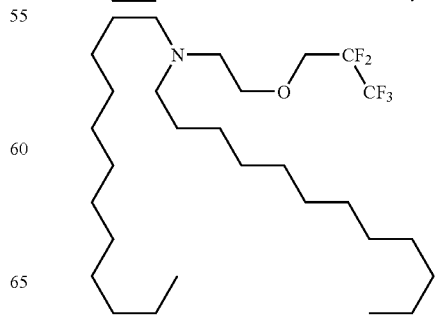

-continued
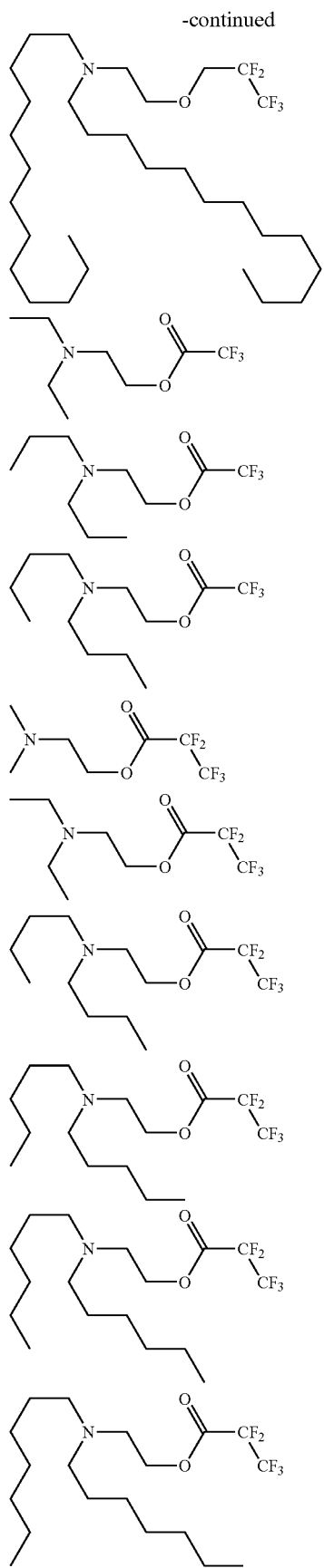
-continued
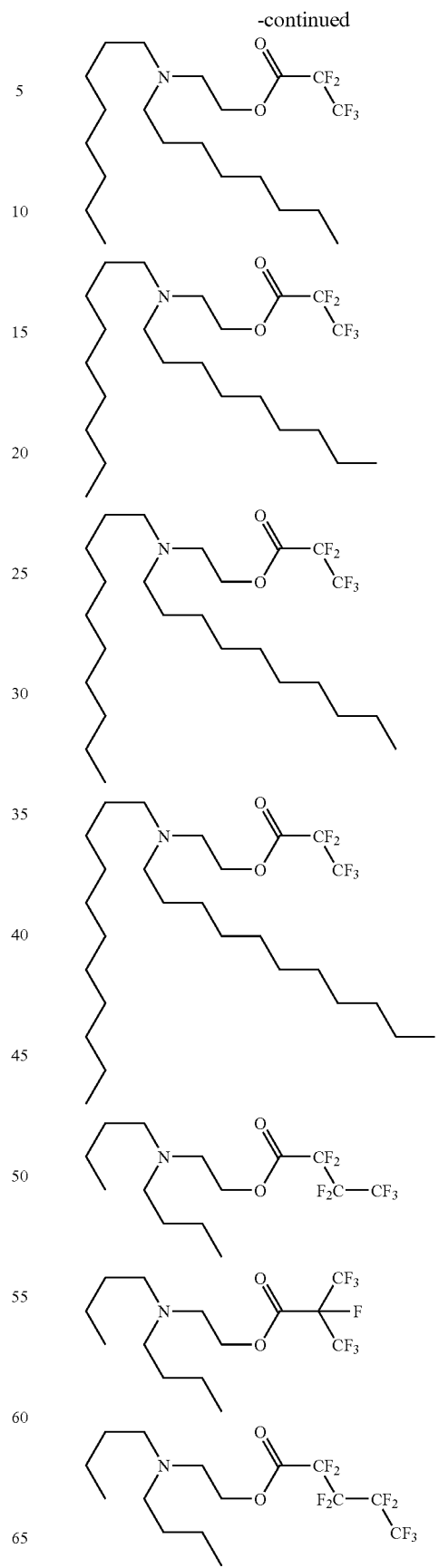

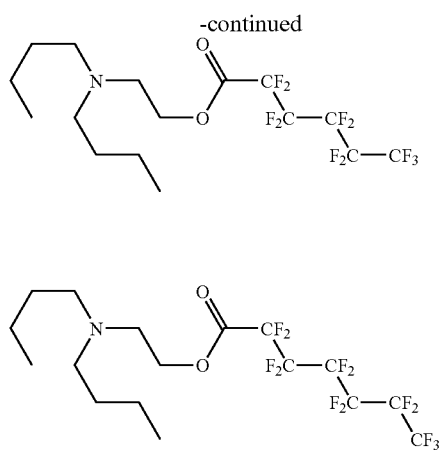
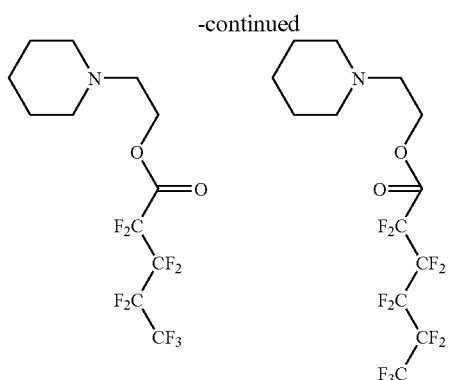
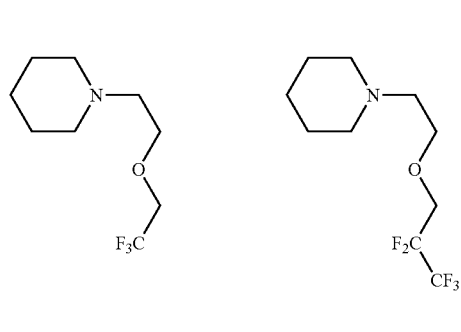
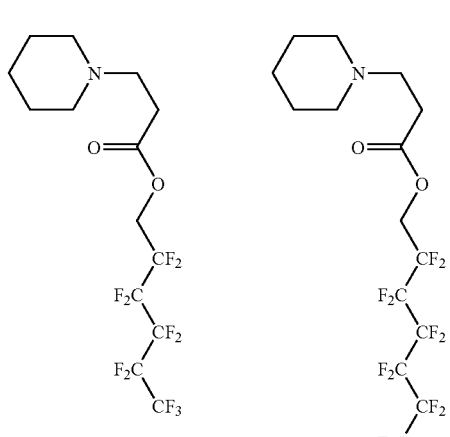
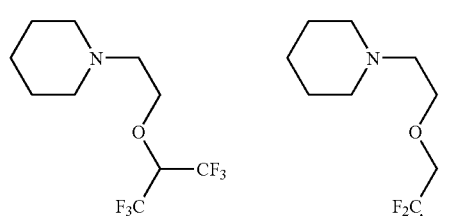
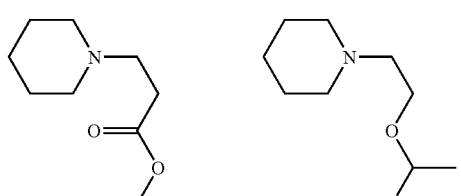
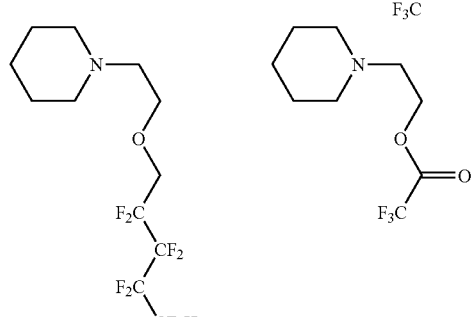
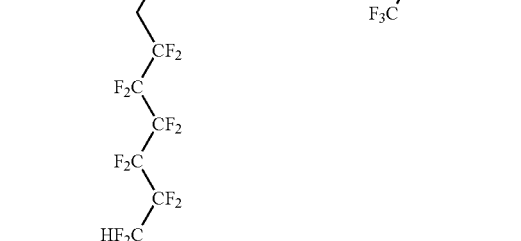
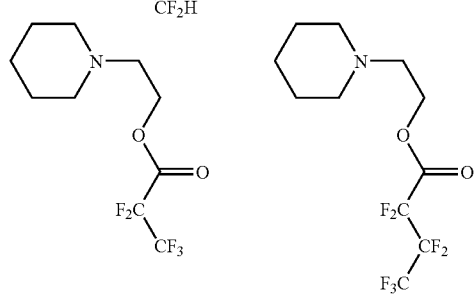
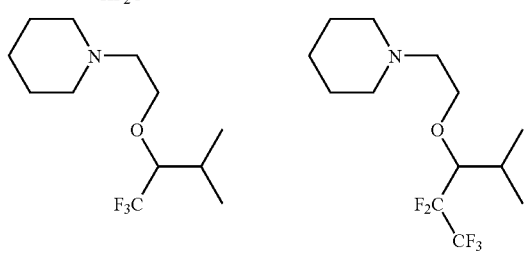

-continued
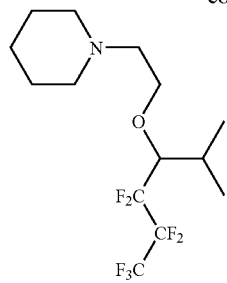 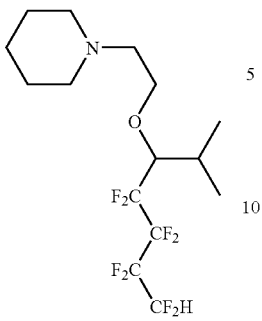
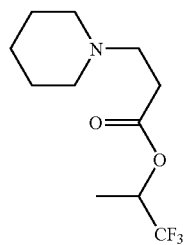 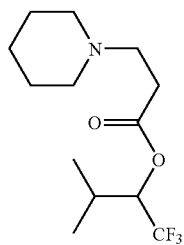
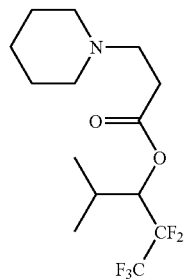 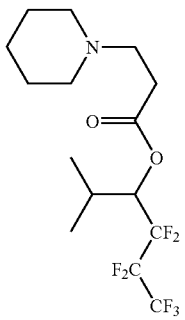
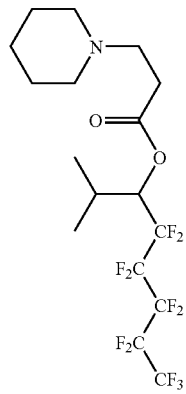 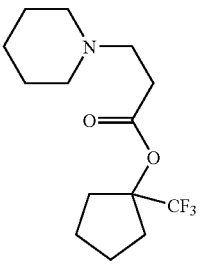
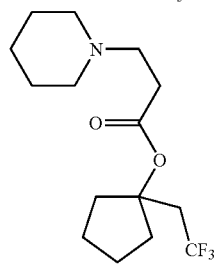 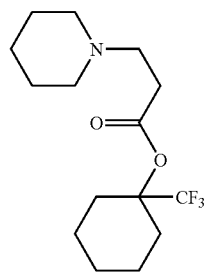
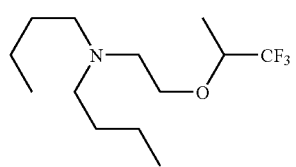
-continued
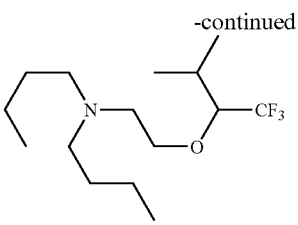
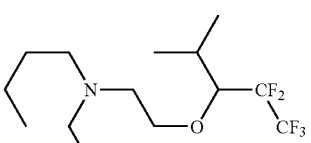
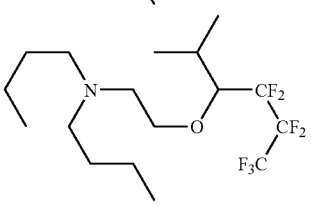
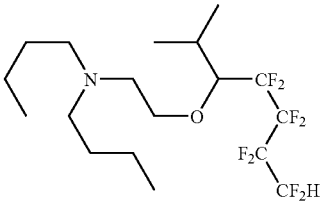
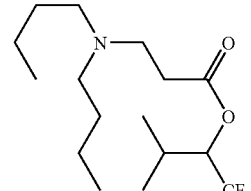
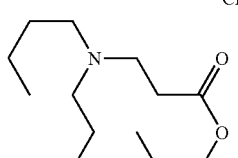
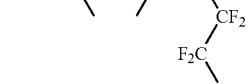
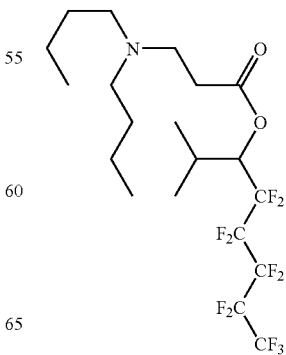

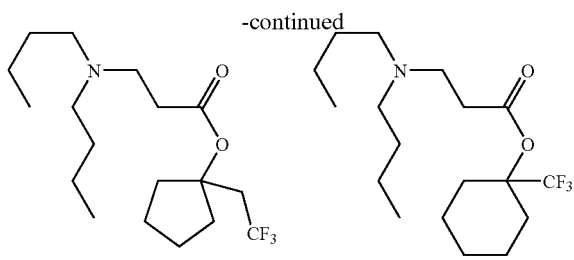

An appropriate amount of the amine compound added is 0.0001 to 5 parts, and more specifically 0.01 to 3 parts by weight per 100 parts by weight of the base resin in the protective coating material. Less than 0.0001 phr may achieve little or no addition effect whereas more than 5 phr may lead to a T-top resist profile after development or a failure of hole pattern opening.

Also, a sulfonamide compound may be added to the protective coating material to inhibit migration of the amine compound within the resist film. The sulfonamide compound used herein is preferably a non-aromatic compound which is not absorptive at wavelength 193 nm. Reaction products of alkylamines with sulfonic acids are suitable, for example, sulfonamides of $C_2$-$C_{30}$ alkylamines including methanesulfonyl piperidine, n-butanesulfonyl piperidine, trifluoromethanesulfonyl piperidine, nonafluorobutanesulfonyl piperidine, trifluoromethanesulfonyl butylamine, trifluoromethanesulfonyl dibutylamine, trifluoromethanesulfonyl pentylamine, trifluoromethanesulfonyl octylamine, trifluoromethanesulfonyl nonylamine, trifluoromethanesulfonyl decylamine, trifluoromethanesulfonyl dodecylamine, trifluoromethanesulfonyl tridecylamine, trifluoromethanesulfonyl tetradecylamine, trifluoromethanesulfonyl pentadecylamine, trifluoromethanesulfonyl hexadecylamine, trifluoromethanesulfonyl adamantylamine, trifluoromethanesulfonyl noradamantylamine, trifluoromethanesulfonyl norbornylamine, trifluoromethanesulfonyl cyclopentylamine, trifluoromethanesulfonyl cyclohexylamine, etc.

An appropriate amount of the sulfonamide compound added is 0.0001 to 5 parts, and more specifically 0.01 to 3 parts by weight per 100 parts by weight of the base resin in the protective coating material. Less than 0.0001 phr may achieve little or no addition effect whereas more than 5 phr may lead to a T-top resist profile after development or a failure of hole pattern opening.

Process

The lithography pattern forming process of the invention involves the steps of forming a photoresist layer on a substrate, forming a protective coating on the photoresist layer from a resist overlay material, exposing the layer structure to light, and developing with a liquid developer. The process is characterized in that the resist overlay material is the water-insoluble, alkali-soluble resist protective coating material defined above.

Specifically, the water-insoluble, alkali-soluble resist protective coating material (resist overlay material) is applied to a photoresist layer on a substrate (or wafer) by suitable techniques, typically spin coating. The coating thickness is preferably in a range of 10 to 500 nm.

The lithography used herein may be either dry lithography in air or nitrogen atmosphere, or immersion lithography wherein a liquid fills in between the resist protective coating and the projection lens. The immersion lithography favors water.

In the immersion lithography, whether or not the wafer edge and rear side are cleaned and the cleaning technique are important in preventing flowing of water to the wafer rear side and leaching from the substrate. For example, after spin coating, the resist protective coating is baked at a temperature of 40 to 130° C. for 10 to 300 seconds for evaporating off the solvent. In the case of dry lithography, edge cleaning is performed during resist layer formation. Such edge cleaning is undesired in the case of immersion lithography because the substrate surface is hydrophilic so that water may be left on the substrate surface at the edge. It is sometimes recommended to omit edge cleaning during the spin coating of the resist protective coating.

In connection with the spin coating of photoresist material, it is proposed in JP-A 9-246173 to reduce the amount of a photoresist solution dispensed. In this technique, a photoresist solution is dispensed and spin coated onto a substrate which has been wetted with a photoresist solvent or a solution miscible with the photoresist solvent. This technique is also applicable to the formation of a resist protective coating by spin coating. If a resist protective coating solution is dispensed and coated onto a resist layer which has been wetted with a solvent, then the amount of a protective coating material dispensed can be reduced. Wetting of the resist surface may be carried out by a spin coating or vapor priming technique, with the spin coating technique being commonly used. The solvent used for this purpose may be selected from higher alcohol, ether and fluorochemical solvents in which the resist layer is not dissolved.

Once the resist protective coating is formed on the resist layer, light exposure in water is carried out by KrF or ArF immersion lithography. This is followed by post-exposure bake (PEB). Sometimes water is left on the resist protective coating prior to PEB. If PEB is performed in the presence of residual water, water can penetrate through the protective coating to suck up the acid in the resist layer, impeding pattern formation. To avoid this trouble, the water on the protective coating must be fully removed prior to PEB. The water on the protective coating can be removed by suitable means, for example, spin drying, purging of the protective coating surface with dry air or nitrogen, or optimizing the water recovery nozzle configuration on a stage or water recovery process. Additionally, designing and utilization of a material having high water repellency and water slip like the inventive polymers is also effective for separating off water.

PEB is followed by development in an alkaline developer for 10 to 300 seconds. An aqueous solution of 2.38 wt % tetramethylammonium hydroxide (TMAH) is commonly used as the alkaline developer. Since the resist protective coating material of the invention is alkali soluble, stripping of the resist protective coating and development of the resist layer may be simultaneously effected.

In the pattern forming process using the resist protective coating material of the invention, the type of photoresist material as an underlying layer is not particularly limited. The resist may be either positive or negative working and also either a monolayer resist of conventional hydrocarbon or a bilayer (or multilayer) resist containing silicon atoms and the like.

For KrF lithography resist materials, the preferred base resins are polyhydroxystyrene or polyhydroxystyrene-(meth) acrylate copolymers in which some or all hydrogen atoms of hydroxyl or carboxyl groups are replaced by acid labile groups.

For ArF lithography resist materials, the base resin must have an aromatic-free structure. Illustrative polymers include copolymers of (meth)acrylic acid derivatives, alternating copolymers of norbornene derivatives and maleic anhydride, copolymers of norbornene derivatives, maleic anhydride and (meth)acrylic acid derivatives, alternating copolymers of tetracyclododecene derivatives and maleic anhydride, copolymers of tetracyclododecene derivatives, maleic anhydride and (meth)acrylic acid derivatives, alternating copolymers of norbornene derivatives and maleimide derivatives, copolymers of norbornene derivatives, maleimide derivatives and (meth)acrylic acid derivatives, alternating copolymers of tetracyclododecene derivatives and maleimide derivatives, copolymers of tetracyclododecene derivatives, maleimide derivatives and (meth)acrylic acid derivatives, polynorbornene, and metathesis ring-opening polymers, which may be used alone or in a combination of any.

Resist materials for use with mask blanks often include novolac resins and hydroxystyrene as the base resin. Those resins in which alkali-soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrenes, vinyl naphthalenes, vinyl anthracenes, vinyl pyrenes, hydroxyvinyl naphthalenes, hydroxyvinyl anthracenes, indenes, hydroxyindenes, acenaphthylenes, and norbornadienes.

In the case of a resist protective coating for use with mask blanks, a photoresist material is coated on a mask blank substrate of $SiO_2$, Cr, CrO, CrN, MoSi or the like before a resist protective coating is formed thereon. By further forming a SOG film and an organic undercoat film between the photoresist and the blank substrate, there is provided a three-layer structure which is also acceptable herein. Once the resist protective coating is formed, the structure is irradiated in vacuum using an electron beam lithography system. The exposure is followed by post-exposure baking (PEB) and development in an alkaline developer for 10 to 300 seconds.

Example

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Monomers 1 to 5 used in Synthesis Examples are identified below by their structural formula.

Monomer 1

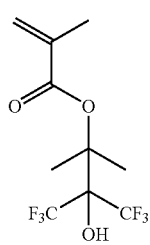

Monomer 2

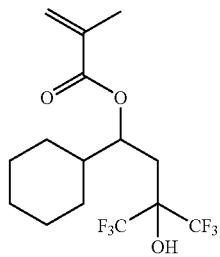

Monomer 3

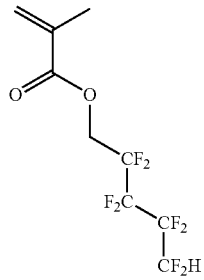

Monomer 4

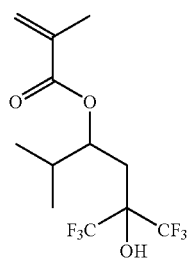

Monomer 5

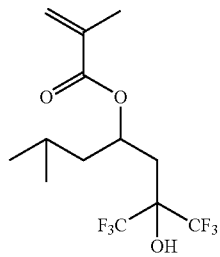

Synthesis Example 1

Copolymerization of Monomers 1 and 2 (80/20)

To a flask in a nitrogen blanket, 76.46 g of Monomer 1, 23.54 g of Monomer 2, 3.74 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 90.1 g of the target polymer, Polymer 1. The resin was analyzed for composition by ¹H-NMR, finding that the copolymer consisted of Monomers 1 and 2 in a ratio of 80/20 mol %. The copolymer was also analyzed for molecular weight by GPC, finding Mw of 9,600 and Mw/Mn of 1.6.

Synthesis Example 2

Copolymerization of Monomers 1, 2 and 3 (80/10/10)

To a flask in a nitrogen blanket, 78.04 g of Monomer 1, 12.01 g of Monomer 2, 9.95 g of Monomer 3, 3.82 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 91.0 g of the target polymer, Polymer 2. The resin was analyzed for composition by ¹H-NMR, finding that the copolymer consisted of Monomers 1, 2 and 3 in a ratio of 79/11/10 mol %. The copolymer was also analyzed for molecular weight by GPC, finding Mw of 9,200 and Mw/Mn of 1.6.

Synthesis Example 3

Copolymerization of Monomers 1 and 4 (80/20)

To a flask in a nitrogen blanket, 78.50 g of Monomer 1, 21.50 g of Monomer 4, 3.84 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 90.4 g of the target polymer, Polymer 3. The resin was analyzed for composition by ¹H-NMR, finding that the copolymer consisted of Monomers 1 and 4 in a ratio of 79/21 mol %. The copolymer was also analyzed for molecular weight by GPC, finding Mw of 9,500 and Mw/Mn of 1.6.

Synthesis Example 4

Copolymerization of Monomers 1, 3 and 4 (80/10/10)

To a flask in a nitrogen blanket, 79.09 g of Monomer 1, 10.09 g of Monomer 3, 10.83 g of Monomer 4, 3.87 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 90.0 g of the target polymer, Polymer 4. The resin was analyzed for composition by ¹H-NMR, finding that the copolymer consisted of Monomers 1, 3 and 4 in a ratio of 80/10/10 mol %. The copolymer was also analyzed for molecular weight by GPC, finding Mw of 9,300 and Mw/Mn of 1.6.

Synthesis Example 5

Copolymerization of Monomers 1 and 5 (80/20)

To a flask in a nitrogen blanket, 77.78 g of Monomer 1, 22.22 g of Monomer 5, 3.80 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 91.4 g of the target polymer, Polymer 5. The resin was analyzed for composition by ¹H-NMR, finding that the copolymer consisted of Monomers 1 and 5 in a ratio of 79/21 mol %. The copolymer was also analyzed for molecular weight by GPC, finding Mw of 9,300 and Mw/Mn of 1.6.

Synthesis Example 6

Copolymerization of Monomers 1, 3 and 5 (80/10/10)

To a flask in a nitrogen blanket, 78.71 g of Monomer 1, 10.04 g of Monomer 3, 11.25 g of Monomer 5, 3.85 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 91.0 g of the target polymer, Polymer 6. The resin was analyzed for composition by $^1$H-NMR, finding that the copolymer consisted of Monomers 1, 3 and 5 in a ratio of 79/10/11 mol %. The copolymer was also analyzed for molecular weight by GPC, finding Mw of 9,100 and Mw/Mn of 1.6.

Synthesis Example 7

Copolymerization of Monomers 1 and 5 (70/30)

To a flask in a nitrogen blanket, 67.12 g of Monomer 1, 32.88 g of Monomer 5, 3.75 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 89.2 g of the target polymer, Polymer 7. The resin was analyzed for composition by $^1$H-NMR, finding that the copolymer consisted of Monomers 1 and 5 in a ratio of 70/30 mol %. The copolymer was also analyzed for molecular weight by GPC, finding Mw of 9,200 and Mw/Mn of 1.6.

Synthesis Example 8

Copolymerization of Monomer 1, Monomer 5 and Methacrylic Acid (60/30/10)

To a flask in a nitrogen blanket, 61.72 g of Monomer 1, 35.27 g of Monomer 5, 3.01 g of methacrylic acid, 4.03 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 92.3 g of the target polymer, Polymer 8. The resin was analyzed for composition by $^1$H-NMR, finding that the copolymer consisted of Monomer 1, Monomer 5 and methacrylic acid in a ratio of 61/30/9 mol %. The copolymer was also analyzed for molecular weight by GPC, finding Mw of 8,500 and Mw/Mn of 1.6.

Comparative Synthesis Example 1

Copolymerization of Monomers 1 and 3 (80/20)

To a flask in a nitrogen blanket, 79.68 g of Monomer 1, 20.32 g of Monomer 3, 3.90 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 94.0 g of the target polymer, Comparative Polymer 1. The resin was analyzed for composition by $^1$H-NMR, finding that the copolymer consisted of Monomers 1 and 3 in a ratio of 79/21 mol %. The copolymer was also analyzed for molecular weight by GPC, finding Mw of 8,000 and Mw/Mn of 1.6.

Comparative Synthesis Example 2

Synthesis of Homopolymer of Monomer 1

To a flask in a nitrogen blanket, 100.0 g of Monomer 1, 3.91 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated polymer was filtered. The polymer was washed four times with 600 g of a 9/1 solvent mixture of isopropyl ether and hexane, whereupon white solids were isolated. The white solids were vacuum dried at 50° C. for 20 hours, obtaining 92.1 g of the target polymer, Comparative Polymer 2. The copolymer was also analyzed for molecular weight by GPC, finding Mw of 8,400 and Mw/Mn of 1.6.

Comparative Synthesis Example 3

Synthesis of Homopolymer of Monomer 2

To a flask in a nitrogen blanket, 100.0 g of Monomer 2, 3.18 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated polymer was filtered. The polymer was washed four times with 600 g of a 9/1 solvent mixture of isopropyl ether and hexane, whereupon white solids were isolated. The white solids were vacuum dried at 50° C. for 20 hours, obtaining 90.4 g of the target polymer, Comparative Polymer 3. The copolymer was also analyzed for molecular weight by GPC, finding Mw of 8,300 and Mw/Mn of 1.6.

Comparative Synthesis Example 4

Synthesis of Homopolymer of Monomer 5

To a flask in a nitrogen blanket, 100.0 g of Monomer 5, 3.42 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated polymer was filtered. The polymer was washed four times with 600 g of a 9/1 solvent mixture of isopropyl ether and hexane, whereupon white solids were isolated. The white solids were vacuum dried at 50° C. for 20 hours, obtaining 90.0 g of the target polymer, Comparative Polymer 4. The copolymer was also analyzed for molecular weight by GPC, finding Mw of 8,200 and Mw/Mn of 1.6.

Comparative Synthesis Example 5

Synthesis of Homopolymer of Monomer 6

To a flask in a nitrogen blanket, 100.0 g of Monomer 6, shown below, 3.91 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 4,000 g of water, after which the precipitated polymer was filtered. The polymer was washed four times with 600 g of a 9/1 solvent mixture of isopropyl ether and hexane, whereupon white solids were isolated. The white solids were vacuum dried at 50° C. for 20 hours, obtaining 90.4 g of the target polymer, Comparative Polymer 5. The copolymer was also analyzed for molecular weight by GPC, finding Mw of 8,300 and Mw/Mn of 1.6.

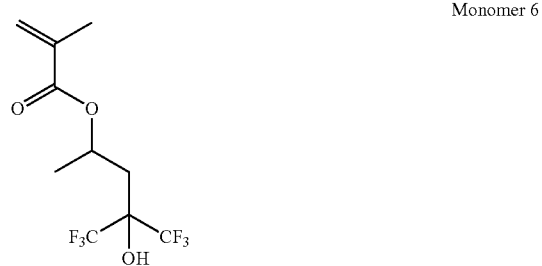

Monomer 6

Examples and Comparative Examples

Inventive Polymers 1 to 8 and Comparative Polymers 1 to 5 are the polymers prepared in corresponding Synthesis Examples described above.

Resist protective coating solutions TC-1 to 8 and Comparative-TC-1 to 5 were prepared by dissolving 1.0 g of each of Inventive Polymers 1 to 8 and Comparative Polymers 1 to 5 in a solvent mixture of 23 g of diisopentyl ether and 2 g of 2-methyl-1-butanol and filtering through a polypropylene filter with a pore size of 0.2 μm. With respect to Polymers 1 and 7, additional resist protective coating solutions TC-9 and 10 were prepared by dissolving 1.0 g of the polymer and 3.0 mg of Base 1, shown below, in a solvent mixture of 23 g of diisopentyl ether and 2 g of 2-methyl-1-butanol and filtering through a polypropylene filter with a pore size of 0.2 μm.

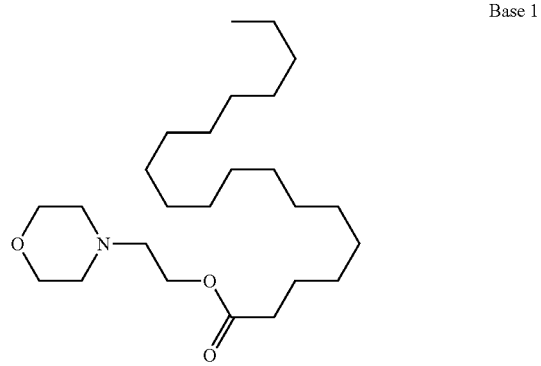

Base 1

The resist protective coating solutions were spin coated onto silicon substrates and baked at 100° C. for 60 seconds to form protective coatings TC-1 to 10 and Comparative-TC-1 to 5 of 50 nm thick. Using a spectroscopic ellipsometer of J. A. Woollam Co., the refractive index at wavelength 193 nm of the protective coatings was determined. The results are shown in Table 1.

The wafers on which the resist protective coatings had been formed by the above procedure were rinsed with deionized water for 5 minutes. Changes of coating thickness were observed. The results are also shown in Table 1.

Also the wafers on which the resist protective coatings had been formed by the above procedure were developed with a 2.38 wt % tetramethylammonium hydroxide (TMAH) aqueous solution. After development, a coating thickness was measured. The results are also shown in Table 1.

For contact angle measurement, an inclination contact angle meter prop Master 500 by Kyowa Interface Science Co., Ltd. was used. On the wafers with the resist protective coatings which were kept horizontal, 50 μL of deionized water was dropped to form a droplet. While the wafer was gradually inclined, the angle (sliding angle) at which the droplet started sliding down was determined as well as receding contact angle. The results are also shown in Table 1.

A smaller sliding angle indicates an easier flow of water on the coating. A larger receding contact angle indicates that fewer liquid droplets are left during high-speed scan exposure. It is seen that the polymers within the scope of the invention are improved in sliding angle and receding contact angle over the comparative polymers.

post-exposure baked (PEB) at 110° C. for 60 seconds, and developed with a 2.38 wt % TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 75-nm line-and-space pattern and sensitivity. The results are shown in Table 2.

Next, 0.5 μl of water droplet was dropped on the resist film after development, and a contact angle at the interface between the resist and water droplet was measured. The results are also shown in Table 2.

TABLE 1

| Resist protective coating | Polymer for protective coating | Refractive index @ 193 nm | Thickness change before and after rinsing (nm) | Thickness after development (nm) | Sliding angle (°) | Receding contact angle (°) |
|---|---|---|---|---|---|---|
| TC-1 | Polymer 1 | 1.54 | 0 | 0 | 12 | 74 |
| TC-2 | Polymer 2 | 1.53 | 0 | 0 | 12 | 75 |
| TC-3 | Polymer 3 | 1.54 | 0 | 0 | 12 | 74 |
| TC-4 | Polymer 4 | 1.53 | 0 | 0 | 13 | 74 |
| TC-5 | Polymer 5 | 1.54 | 0 | 0 | 12 | 74 |
| TC-6 | Polymer 6 | 1.54 | 0 | 0 | 12 | 74 |
| TC-7 | Polymer 7 | 1.54 | 0 | 0 | 12 | 76 |
| TC-8 | Polymer 8 | 1.54 | 0 | 0 | 15 | 72 |
| TC-9 | Polymer 1 | 1.54 | 0 | 0 | 12 | 73 |
| TC-10 | Polymer 7 | 1.54 | 0 | 0 | 12 | 76 |
| Comparative TC-1 | Comparative Polymer 1 | 1.53 | 0 | 0 | 13 | 71 |
| Comparative TC-2 | Comparative Polymer 2 | 1.53 | 0 | 0 | 15 | 69 |
| Comparative TC-3 | Comparative Polymer 3 | 1.55 | 0 | 50 | 10 | 88 |
| Comparative TC-4 | Comparative Polymer 4 | 1.54 | 0 | 50 | 10 | 88 |
| Comparative TC-5 | Comparative Polymer 5 | 1.54 | 0 | 0 | 15 | 73 |

In another run, a resist solution was prepared by dissolving 5 g of a resist polymer, shown below, 0.25 g of a photoacid generator PAG1, shown below, and 0.05 g of Quencher 1 in 75 g of propylene glycol monoethyl ether acetate (PGMEA) and filtering through a polypropylene filter having a pore size of 0.2 μm. An antireflective coating ARC-29A (Nissan Chemical Co., Ltd.) was formed on a silicon substrate to a thickness of 87 nm. The resist solution was applied onto the antireflective coating and baked at 120° C. for 60 seconds, forming a resist film of 150 nm thick. The resist protective coating solution was applied onto the resist film and baked at 100° C. for 60 seconds. In order to simulate immersion lithography, light exposure was followed by rinsing of the coating with deionized water for 5 minutes. The structure was exposed by means of an ArF scanner model S307E (Nikon Corp., NA 0.85, a 0.93, 4/5 annular illumination, 6% halftone phase shift mask), rinsed for 5 minutes while splashing deionized water,

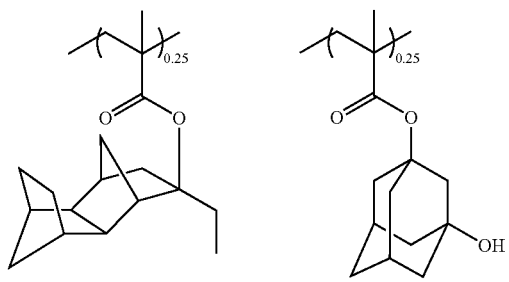

Resist Polymer
Mw: 7,600
Mw/Mn: 1.76

-continued

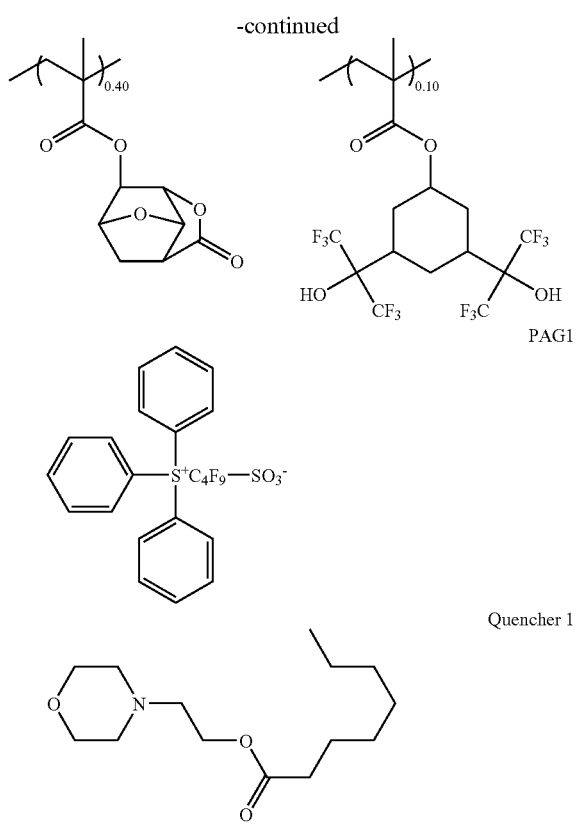

TABLE 2

| Resist protective coating | Polymer for protective coating | Sensitivity (mJ/cm²) | 75-nm pattern profile | Contact angle with water after development (°) |
|---|---|---|---|---|
| TC-1 | Polymer 1 | 30 | rectangular | 68 |
| TC-2 | Polymer 2 | 30 | rectangular | 71 |
| TC-3 | Polymer 3 | 30 | rectangular | 68 |
| TC-4 | Polymer 4 | 30 | rectangular | 68 |
| TC-5 | Polymer 5 | 30 | rectangular | 68 |
| TC-6 | Polymer 6 | 30 | rectangular | 69 |
| TC-7 | Polymer 7 | 30 | rectangular | 68 |
| TC-8 | Polymer 8 | 30 | rectangular | 66 |
| TC-9 | Polymer 1 | 30 | rectangular | 68 |
| TC-10 | Polymer 7 | 30 | rectangular | 68 |
| Comparative TC-1 | Comparative Polymer 1 | 30 | rectangular | 76 |
| Comparative TC-2 | Comparative Polymer 2 | 28 | round top | 69 |
| Comparative TC-3 | Comparative Polymer 3 | — | not patterned | — |
| Comparative TC-4 | Comparative Polymer 4 | — | not patterned | — |
| Comparative TC-5 | Comparative Polymer 5 | 32 | reversely tapered | 76 |
| no protective coating, conventional process including rinsing after exposure | | 31 | T-top | 76 |
| no protective coating, conventional process excluding rinsing after exposure | | 30 | rectangular | 70 |

When water rinsing was carried out after exposure in the absence of a protective coating, the pattern profile became a T-top profile. This is presumably because the acid generated was dissolved in water. In the presence of a protective coating according to the invention, no change of profile was observed. When the protective coating materials of the invention are used, no increase of contact angle with water after development was observed as compared with dry lithography without protective coating. However, when the protective coating materials of Comparative Examples are used, the resist surface after development became more water repellent.

In a further run, the resist solution and protective coating solutions TC-1, TC-8 and Comparative TC-1, used in the exposure test, were refined by precision filtering through a high-density polyethylene filter with a pore size of 0.02 μm. The resist solution was applied onto an antireflective coating ARC-29A (Nissan Chemical Co., Ltd.) of 87 nm thick formed on a 8-inch silicon substrate and baked at 120° C. for 60 seconds, forming a resist film of 150 nm thick. The resist protective coating solution was applied onto the resist film and baked at 100° C. for 60 seconds. Using an ArF scanner model S307E (Nikon Corp., NA 0.85, a 0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds. Using a flaw detector Win-Win 50-1200 (Tokyo Seimitsu Co., Ltd.), the number of defects in the unexposed portion of the checkered-flag was counted at the pixel size of 0.125 μm. The results are shown in Table 3.

TABLE 3

| Resist protective coating | Polymer | Number of defects |
|---|---|---|
| TC-1 | Polymer 1 | 5 |
| TC-8 | Polymer 8 | 3 |
| Comparative-TC-1 | Comparative Polymer 1 | >8,000 |
| none | — | 30 |

EB Lithography

In an EB exposure test, a positive resist material was prepared by dissolving EB Polymer synthesized by radical polymerization, shown below, in propylene glycol monomethyl ether acetate (PGMEA) and ethyl lactate (EL) and filtering through a filter with a pore size of 0.2 μm.

Using Clean Track Mark 5 (Tokyo Electron Ltd.), the positive resist material was spin coated on a silicon substrate with a diameter of 6 inches and prebaked on a hot plate at 110° C. for 60 seconds to form a resist film of 200 nm thick. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area.

Using Clean Track Mark 5 (Tokyo Electron Ltd.), immediately after the imagewise exposure, the resist film was post-exposure baked (PEB) on a hot plate at 90° C. for 60 seconds and puddle developed in a 2.38 wt % TMAH aqueous solution for 30 seconds to form a positive pattern.

Using a measurement SEM S-7280 (Hitachi, Ltd.), a size change during the vacuum holding duration was determined. After an exposure dose which provided a 1:1 resolution at the top and bottom of a 0.12 μm line-and-space pattern was determined, a 0.12 μm line-and-space pattern at that exposure dose was measured for line width in both the initially exposed area and the 20 hour later exposed area. A difference therebetween is the size change. Positive values of size change indicate that the resist sensitivity varies toward a higher level during vacuum holding whereas negative values indicate that the sensitivity varies toward a lower level.

TABLE 4

| Polymer (pbw) | PAG (pbw) | Basic compound (pbw) | Organic solvent (pbw) | Protective coat | Size change (nm) |
|---|---|---|---|---|---|
| EB Polymer (100) | PAG2 (10) | Quencher 2 (0.4) | PGMEA(700) EL(300) | TC-1 | −1 nm |
| EB Polymer (100) | PAG2 (10) | Quencher 2 (0.4) | PGMEA(700) EL(300) | TC-2 | 0 nm |
| EB Polymer (100) | PAG2 (10) | Quencher 2 (0.4) | PGMEA(700) EL(300) | TC-3 | −1 nm |
| EB Polymer (100) | PAG2 (10) | Quencher 2 (0.4) | PGMEA(700) EL(300) | TC-4 | −1 nm |
| EB Polymer (100) | PAG2 (10) | Quencher 2 (0.4) | PGMEA(700) EL(300) | TC-5 | 0 nm |
| EB Polymer (100) | PAG2 (10) | Quencher 2 (0.4) | PGMEA(700) EL(300) | TC-6 | −1 nm |
| EB Polymer (100) | PAG2 (10) | Quencher 2 (0.4) | PGMEA(700) EL(300) | TC-7 | −1 nm |
| EB Polymer (100) | PAG2 (10) | Quencher 2 (0.4) | PGMEA(700) EL(300) | TC-8 | −1 nm |
| EB Polymer (100) | PAG2 (10) | Quencher 2 (0.4) | PGMEA(700) EL(300) | — | −9 nm |

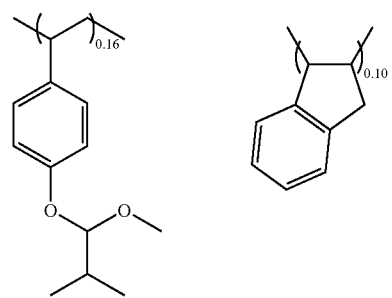
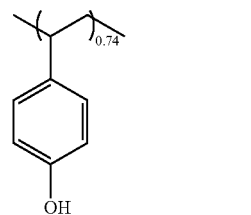

EB Polymer
Mw: 13,600
Mw/Mn: 1.86

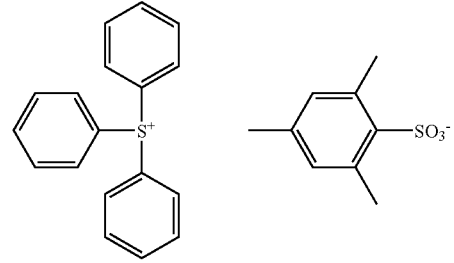

PAG2

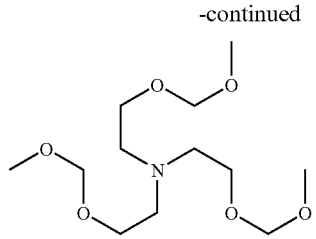

Quencher 2

In the ArF lithography process, the resist took a T-top profile when water rinsing after exposure was conducted in the absence of protective coating. This is presumably because the acid generated was dissolved in water. In the presence of a protective coating according to the invention, a rectangular profile was maintained. In the case of protective coatings of prior art polymers having only hexafluoroalcohol groups as the dissolvable group, the resist profile as developed became slimmed and tapered. In the EB irradiation, the use of a resist protective coating according to the invention improves the stability of a resist during vacuum holding after irradiation.

Japanese Patent Application Nos. 2006-272631 and 2007-097971 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

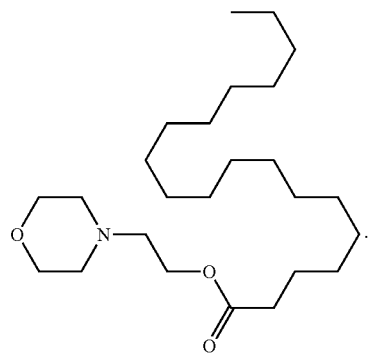

The invention claimed is:

1. A resist protective coating material comprising:
a polymer comprising repeat units having the general formulae (1a) and (1b):

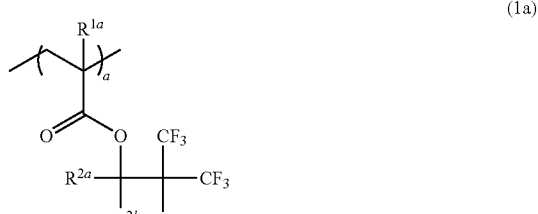

(1a)

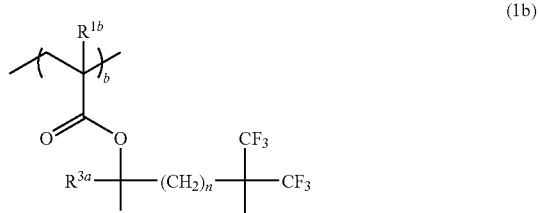

(1b)

wherein $R^{1a}$ and $R^{1b}$ are each independently hydrogen, fluorine or a straight or branched $C_1$-$C_4$ alkyl or fluoroalkyl group, $R^{2a}$, $R^{2b}$, $R^{3a}$ and $R^{3b}$ are each independently hydrogen or a straight, branched or cyclic $C_1$-$C_{20}$ alkyl group, or $R^{2a}$ and $R^{2b}$, and $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring, "a1" and "b1" are numbers satisfying 0<a1<1, 0<b1<1 and 0<a1+b1≦1, and n is an integer of 1 to 4, and a solvent selected from the group consisting of diisopentyl ether, di-n-pentyl ether, methylcyclopentyl ether, methylcyclohexyl ether, di-sec-pentyl ether, di-t-amyl ether and di-n-hexyl ether, said polymer having a weight average molecular weight of 1,000 to 500,000.

2. The resist protective coating material of claim 1 wherein said polymer comprises repeat units having the general formulae (1a) and (1b'):

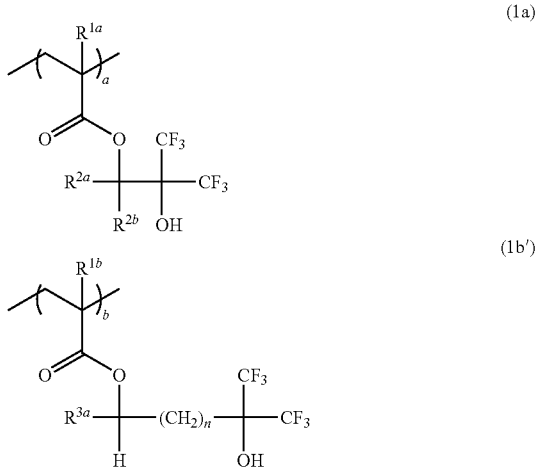

wherein $R^{1a}$ and $R^{1b}$ are each independently hydrogen, fluorine or a straight or branched $C_1$-$C_4$ alkyl or fluoroalkyl group, $R^{2a}$ and $R^{2b}$ are each independently hydrogen or a straight, branched or cyclic $C_1$-$C_{20}$ alkyl group, or $R^{2a}$ and $R^{2b}$ may bond together to form a ring with the carbon atom to which they are attached, and each of $R^{2a}$ and $R^{2b}$ is a straight, branched or cyclic $C_1$-$C_{20}$ alkylene group when they form a ring, $R^{3a}$ is a straight, branched or cyclic $C_3$-$C_8$ alkyl group, "a" and "b" are numbers satisfying $0<a<1$, $0<b<1$ and $a+b=1$, and n is an integer of 1 to 4.

3. A lithography process for forming a pattern, comprising the steps of forming a photoresist layer on a substrate, forming a resist protective coating on the photoresist layer, exposing the layer structure to light, and developing, said resist protective coating being formed of the resist protective coating material of claim 1.

4. The process of claim 3, wherein the exposing step includes immersion lithography comprising irradiating light to the layer structure through a projection lens while keeping a liquid between the projection lens and the substrate.

5. The process of claim 4, wherein the exposing step uses a light source having an exposure wavelength in the range of 180 to 250 nm and water as the liquid between the projection lens and the substrate.

6. The process of claim 3, wherein the developing step uses a liquid alkaline developer for thereby developing the photoresist layer to form a resist pattern and stripping the resist protective coating therefrom at the same time.

7. A lithography process for forming a pattern, comprising the steps of forming a protective coating on a photoresist layer disposed on a mask blank from a resist overlay material, exposing the layer structure in vacuum to electron beam, and developing, said resist overlay material being the resist protective coating material of claim 1.

8. The resist protective coating material of claim 1, further comprising an amine compound having no absorption to ArF light, a boiling point of at least 200° C. under atmospheric pressure, low leaching in water, and basicity.

9. The process of claim 3, wherein the resist protective coating further comprising an amine compound having no absorption to ArF light, a boiling point of at least 200° C. under atmospheric pressure, low leaching in water, and basicity.

10. The process of claim 9, wherein the exposing step uses a light source having an exposure wavelength in the range of 180 to 250 nm and water as the liquid between the projection lens and the substrate.

11. A resist protective coating material comprising a polymer comprising repeat units having the general formulae (1a), (1b) and (2):

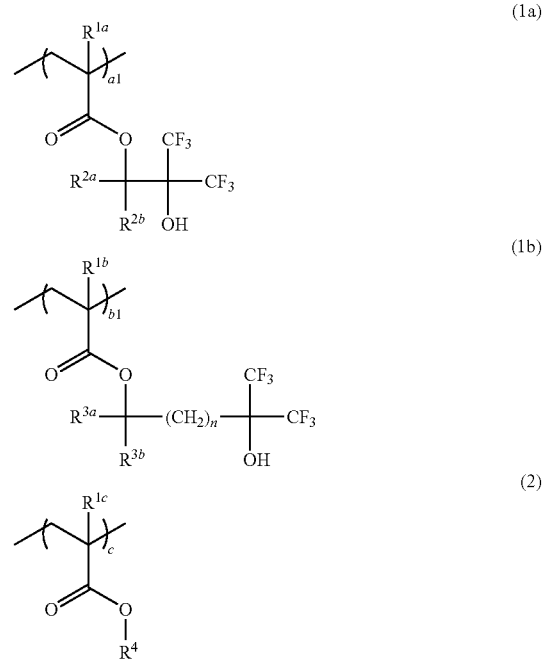

wherein $R^{1a}$, $R^{1b}$ and $R^{1c}$ are each independently hydrogen, fluorine or a straight or branched $C_1$-$C_4$ alkyl or fluoroalkyl group, $R^{2a}$, $R^{2b}$, $R^{3a}$ and $R^{3b}$ are each independently hydrogen or a straight, branched or cyclic $C_1$-$C_{20}$ alkyl group, or $R^{2a}$ and $R^{2b}$, and $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring, $R^4$ is a fluoroalkyl group selected from the group consisting of 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl, "a1" and "b1" are numbers satisfying $0<a1<1$, $0<b1<1$, $0<c<0.7$ and $0<a1+b1+c\leq 1$, and n is an integer of 1 to 4, said polymer having a weight average molecular weight of 1,000 to 500,000.

12. A resist protective coating material comprising a polymer comprising repeat units having the general formulae (1a) and (1b):

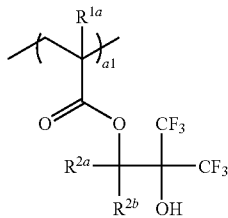

(1a)

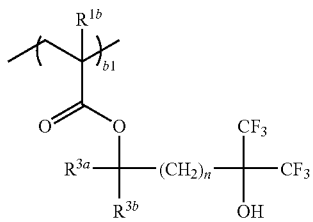

(1b)

wherein $R^{1a}$ and $R^{1b}$ are each independently hydrogen, fluorine or a straight or branched $C_1$-$C_4$ alkyl or fluoroalkyl group, $R^{2a}$, $R^{2b}$, $R^{3a}$ and $R^{3b}$ are each independently hydrogen or a straight, branched or cyclic $C_1$-$C_{20}$ alkyl group, or $R^{2a}$ and $R^{2b}$, and $R^{3a}$ and $R^{3b}$ may bond together to form a ring with the carbon atom to which they are attached, and each of $R^{2a}$, $R^{2b}$, $R^{3a}$ and $R^{3b}$ is a straight, branched or cyclic $C_1$-$C_{20}$ alkylene group when they form a ring, "a1" and "b1" are numbers satisfying $0<a1<1$, $0<b1<1$ and $0<a1+b1\leq1$ and n is an integer of 1 to 4, and an amine compound having an ester or ether group represented by the following formula (B-2):

$$N(X)_n(Y)_{3-n} \quad (B\text{-}2)$$

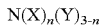 (X)-1

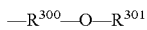 (X)-2

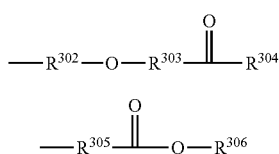 (X)-3 wherein n is equal to 1, 2 or 3, the side chain X, which may be the same or different, is independently selected from groups of the general formulas (X)-1 to (X)-3, two or three X's may bond together to form a ring, the side chain Y, which may be the same or different, is independently a straight, branched or cyclic $C_1$-$C_{30}$ alkyl group, $R^{300}$, $R^{302}$ and $R^{305}$ are independently straight or branched $C_1$-$C_4$ alkylene groups; $R^{301}$ and $R^{304}$ are independently straight, branched or cyclic $C_1$-$C_{30}$ alkyl groups which may contain fluorine atoms; $R^{303}$ is a single bond or a straight or branched $C_1$-$C_4$ alkylene group; $R^{306}$ is a straight, branched or cyclic $C_1$-$C_{30}$ alkyl group which may contain fluorine atoms, said polymer having a weight average molecular weight of 1,000 to 500,000.

13. The resist protective coating material of claim 1, wherein an alcohol compound of 4 to 8 carbon atoms is further added.

14. The resist protective coating material of claim 11, wherein said polymer comprises repeat units having the general formulae (1a), (1b') and (2):

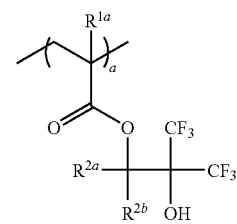

(1a)

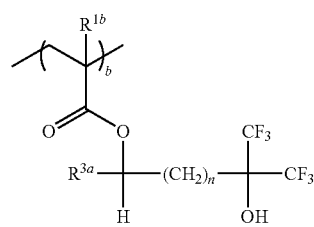

(1b')

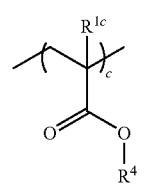

(2)

wherein $R^{1a}$, $R^{1b}$ and $R^{1c}$ are each independently hydrogen, fluorine or a straight or branched $C_1$-$C_4$ alkyl or fluoroalkyl group, $R^{2a}$ and $R^{2b}$ are each independently hydrogen or a straight, branched or cyclic $C_1$-$C_{20}$ alkyl group, or $R^{2a}$ and $R^{2b}$ may bond together to form a ring with the carbon atom to which they are attached, and each of $R^{2a}$ and $R^{2b}$ is a straight, branched or cyclic $C_1$-$C_{20}$ alkylene group when they form a ring, $R^{3a}$ is a straight, branched or cyclic $C_3$-$C_8$ alkyl group, $R^4$ is a fluoroalkyl group selected from the group consisting of 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl, "a" and "b" are numbers satisfying $0<a<1$, $0<b<1$, $0<c\leq0.7$, and $a+b+c=1$, and n is an integer of 1 to 4.

15. The resist protective coating material of claim 11, further comprising an ether compound of 8 to 20 carbon atoms.

16. The resist protective coating material of claim 11, further comprising an ether compound of 8 to 20 carbon atoms and an alcohol compound of 4 to 8 carbon atoms.

17. The resist protective coating material of claim 11, further comprising an amine compound having no absorption to ArF light, a boiling point of at least 200° C. under atmospheric pressure, low leaching in water, and basicity.

18. A lithography process for forming a pattern, comprising the steps of:

forming a photoresist layer on a substrate;

forming a resist protective coating on the photoresist layer, exposing the layer structure to light; and developing, said resist protective coating being formed of the resist protective coating material of claim 11.

19. The process of claim 18, wherein the exposing step includes immersion lithography comprising irradiating light to the layer structure through a projection lens while keeping a liquid between the projection lens and the substrate.

20. The resist protective coating material of claim 12, wherein said polymer comprises repeat units having the general formulae (1a) and (1b'):

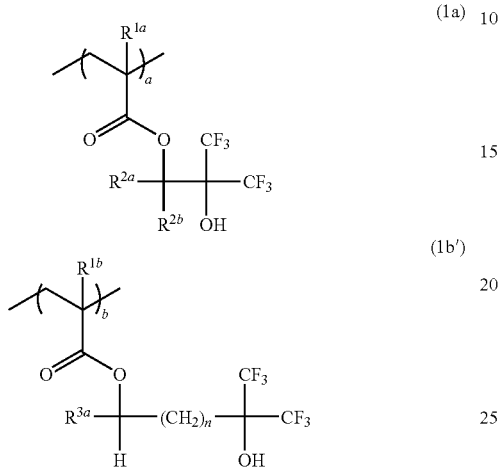

(1a)

(1b')

wherein $R^{1a}$ and $R^{1b}$ are each independently hydrogen, fluorine or a straight or branched $C_1$-$C_4$ alkyl or fluoroalkyl group, $R^{2a}$ and $R^{2b}$ are each independently hydrogen or a straight, branched or cyclic $C_1$-$C_{20}$ alkyl group, or $R^{2a}$ and $R^{2b}$ may bond together to form a ring with the carbon atom to which they are attached, and each of $R^{2a}$ and $R^{2b}$ is a straight, branched or cyclic $C_1$-$C_{20}$ alkylene group when they form a ring, $R^{3a}$ is a straight, branched or cyclic $C_3$-$C_8$ alkyl group, "a" and "b" are numbers satisfying $0<a<1$, $0<b<1$ and $a+b=1$, and n is an integer of 1 to 4.

21. The resist protective material of claim 12, wherein said polymer further comprising repeat units of one or more types selected from the general formulae (2) to (5):

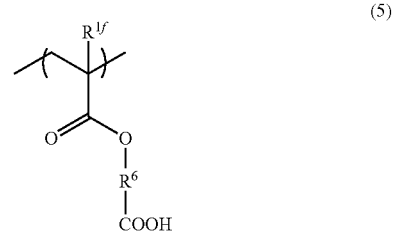

(2)

(3)

(4)

-continued (5)

wherein $R^{1c}$, $R^{1d}$, $R^{1e}$, and $R^{1f}$ are each independently a hydrogen atom, a fluorine atom or a straight or branched $C_1$-$C_4$ alkyl or fluoroalkyl group, $R^4$ is a $C_2$-$C_{10}$ fluoroalkyl group, $R^5$ is an adhesive group, and $R^6$ is a divalent organic group of 1 to 20 carbon atoms.

22. The resist protective coating material of claim 12, further comprising an ether compound of 8 to 20 carbon atoms.

23. The resist protective coating material of claim 12, further comprising an ether compound of 8 to 20 carbon atoms and an alcohol compound of 4 to 8 carbon atoms.

24. The resist protective coating material of claim 1, wherein the polymer comprises recurring units of formula (A) or (B):

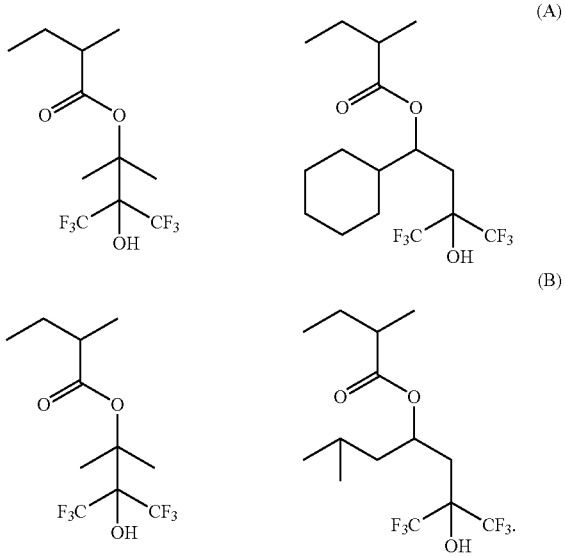

(A)

(B)

25. The resist protective coating material of claim 24, further comprising an amine having the following formula: